United States Patent
Jin et al.

(10) Patent No.: US 10,211,416 B2
(45) Date of Patent: Feb. 19, 2019

(54) FLEXIBLE DISPLAY PANEL, FABRICATION METHOD, AND FLEXIBLE DISPLAY APPARATUS

(71) Applicants: Shanghai Tianma AM-OLED Co., Ltd., Shanghai (CN); Tianma Micro-Electronics Co., Ltd., Shenzhen (CN)

(72) Inventors: Jian Jin, Shanghai (CN); Congyi Su, Shanghai (CN); Gang Liu, Shanghai (CN); Zhenying Li, Shanghai (CN)

(73) Assignees: SHANGHAI TIANMA AM-OLED CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 15/895,491

(22) Filed: Feb. 13, 2018

(65) Prior Publication Data

US 2018/0175311 A1 Jun. 21, 2018

Related U.S. Application Data

(63) Continuation of application No. 15/497,792, filed on Apr. 26, 2017, now Pat. No. 9,929,374.

(30) Foreign Application Priority Data

Dec. 28, 2016 (CN) .......................... 2016 1 1238279

(51) Int. Cl.
*H01L 51/52* (2006.01)
*H01L 51/56* (2006.01)
(Continued)

(52) U.S. Cl.
CPC ...... *H01L 51/0097* (2013.01); *H01L 27/3244* (2013.01); *H01L 33/44* (2013.01);
(Continued)

(58) Field of Classification Search
CPC .................... H01L 51/0097; H01L 2251/5338
See application file for complete search history.

(56) References Cited

U.S. PATENT DOCUMENTS

2015/0102298 A1 * 4/2015 Namkung ........... H01L 51/0097
257/40

FOREIGN PATENT DOCUMENTS

| CN | 104183620 A | 12/2014 |
| CN | 104659062 A | 5/2015 |
| CN | 104885140 A | 9/2015 |

* cited by examiner

*Primary Examiner* — Daniel P Shook
(74) *Attorney, Agent, or Firm* — Anova Law Group, PLLC

(57) ABSTRACT

A flexible display panel is provided. The flexible display panel comprises: a flexible substrate; an organic light-emitting layer disposed on a side of the flexible substrate and having a first side facing the flexible substrate and an opposing side; and a thin-film-encapsulation layer disposed on the opposing side of the organic light-emitting layer. The thin-film-encapsulation layer includes at least one organic encapsulation layer and at least one inorganic encapsulation layer. The flexible display panel includes at least one bending area. The at least one inorganic encapsulation layer has a first side facing the flexible substrate and an opposing side. In the at least one bending area, at least one groove is formed on the opposing side of the at least one inorganic encapsulation layer. A bottom width W of the at least one groove is configured to be $$W \geq \frac{n}{180°}\pi R.$$

24 Claims, 23 Drawing Sheets

(51) Int. Cl.
*H01L 51/00* (2006.01)
*H01L 27/32* (2006.01)
*H01L 33/44* (2010.01)

(52) U.S. Cl.
CPC ...... *H01L 51/5253* (2013.01); *H01L 51/5281* (2013.01); *H01L 51/56* (2013.01); *H01L 2251/5338* (2013.01); *H01L 2251/566* (2013.01)

FLEXIBLE DISPLAY PANEL, FABRICATION METHOD, AND FLEXIBLE DISPLAY APPARATUS

CROSS-REFERENCES TO RELATED APPLICATIONS

This application is a continuation-in-part (CIP) application of U.S. patent application Ser. No. 15/497,792, filed on Apr. 26, 2017, which claims the priority of Chinese Patent Application No. CN 201611238279.2, filed on Dec. 28, 2016, the entire contents of which are incorporated herein by reference.

FIELD OF THE DISCLOSURE

The present disclosure generally relates to the display technology and, more particularly, relates to a flexible display panel, a fabrication method for the flexible display panel, and a flexible display apparatus.

BACKGROUND

Emerging flexible display technology has gained a lot of attention. When bending an existing flexible display panel, due to the thickness of the flexible display panel, a substantially large bending stress is generated in the flexible display panel. The substantially large bending stress easily causes cracks or even breakage in the bending area of the display panel.

The disclosed flexible display panel, fabrication method for the flexible display panel, and flexible display apparatus are directed to solve one or more problems set forth above and other problems.

BRIEF SUMMARY OF THE DISCLOSURE

One aspect of the present disclosure provides a flexible display panel. The flexible display panel comprises: a flexible substrate; an organic light-emitting layer disposed on a side of the flexible substrate and having a first side facing the flexible substrate and an opposing side; and a thin-film-encapsulation layer disposed on the opposing side of the organic light-emitting layer. The thin-film-encapsulation layer includes at least one organic encapsulation layer and at least one inorganic encapsulation layer. The flexible display panel includes at least one bending area. The at least one inorganic encapsulation layer has a first side facing the flexible substrate and an opposing side. In the at least one bending area, at least one groove is formed on the opposing side of the at least one inorganic encapsulation layer. A bottom width W of the at least one groove is configured to be $$W \geq \frac{n}{180°}\pi R.$$

Another aspect of the present disclosure provides a flexible display panel. The flexible display panel comprises: a flexible substrate; a thin-film-transistor layer disposed on the flexible substrate, wherein the thin-film-transistor layer includes at least one insulating layer, and the thin-film-transistor layer has a first side facing the flexible substrate and an opposing side; a planarization layer disposed on the opposing side of the thin-film-transistor layer, wherein the planarization layer has a first side facing the flexible substrate and an opposing side; an organic light-emitting layer disposed on the opposing side of the planarization layer, wherein the organic light-emitting layer has a first side facing the flexible substrate and an opposing side, the organic light-emitting layer includes a plurality of organic light-emitting components, an organic light-emitting component includes a first electrode, a pixel defining layer, an organic light-emitting material layer and a second electrode arranged disposed on the flexible substrate; a thin-film-encapsulation layer disposed on the opposing side of the organic light-emitting layer, wherein the thin-film-encapsulation layer includes at least one organic encapsulation layer and at least one inorganic encapsulation layer; and a plurality of photo spacers disposed between the organic light-emitting layer and the thin-film-encapsulation layer. The flexible display panel includes at least one bending area. In the at least one bending area, at least one groove is formed on a photo spacer, the pixel defining layer in the organic light-emitting layer, the at least one insulating layer in the thin-film-transistor layer, or the planarization layer. A bottom width W of the at least one groove is configured to be $$W \geq \frac{n}{180°}\pi R,$$

where n is a maximum bending angle of the at least one bending area, $0° < n \leq 180°$, and R is a bending radius of the at least one bending area.

Another aspect of the present disclosure provides a flexible display apparatus comprising the disclosed flexible display panel.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts. It should be understood that the exemplary embodiments described herein are only intended to illustrate and explain the present invention and not to limit the present invention. In addition, it should also be noted that, for ease of description, only part, but not all, of the structures associated with the present invention are shown in the accompanying drawings. All other embodiments obtained by those skilled in the art without making creative work are within the scope of the present invention.

The present disclosure will now be described in detail with reference to the accompanying drawings. When illustrating the embodiments of the present disclosure, certain areas of the schematic views of the device structures may be disproportionally enlarged for the convenience of illustration. In addition, the three-dimensional sizes including the length, width, and depth should be included in the actual implementation of the present disclosure.

Figure 1A:
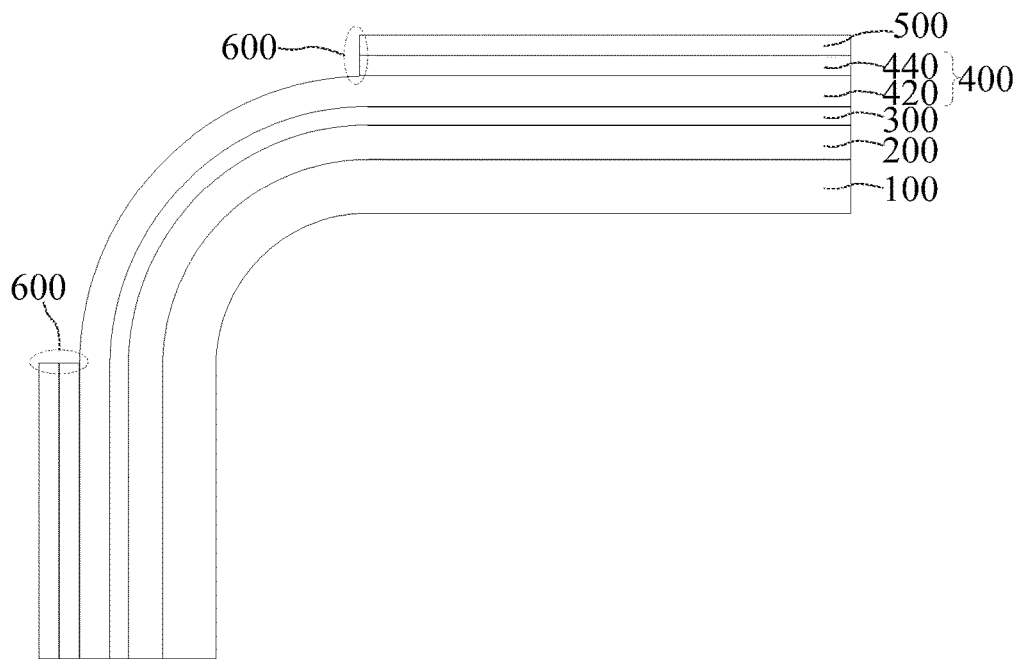
FIG. 1A illustrates a cross-sectional view of an existing display panel.

FIG. 1A illustrates a cross-sectional view of an existing display panel. As shown in FIG. 1, the existing display panel often includes a substrate 100, a thin-film-transistor layer 200 disposed on the substrate 100, an organic light-emitting layer 300 disposed on the thin-film-transistor layer 200, a thin-film-encapsulation layer 400 disposed on the organic light-emitting layer 300, a polarization layer 500 disposed on the thin-film-encapsulation layer 400, and a coverage window disposed on the polarization layer 500.

The thin-film-encapsulation layer 400 includes a first encapsulation sub-layer 420 and a second encapsulation sub-layer 440. The first encapsulation sub-layer 420 is formed by an organic insulation material. The second encapsulation sub-layer 440 is formed by a resin material. A portion of the second encapsulation sub-layer 440 in a bending area is removed for reducing the bending stress. However, when bending the flexible display panel, the bending stress tends to concentrate in the areas 600 and, thus, the bending stress in the bending area may not be effectively reduced. Further, the removal of the portion of the second encapsulation sub-layer 440 in the bending area may significantly degrade the encapsulation of the thin-film-encapsulation layer 400.

The present disclosure provides an improved flexible display panel. The flexible display panel may comprise a flexible substrate, an organic light-emitting layer disposed on a side of the flexible substrate and having a first side facing the flexible substrate and an opposing side, and a thin-film-encapsulation layer disposed on the opposing side of the organic light-emitting layer. The thin-film-encapsulation layer may include at least one organic encapsulation layer and at least one inorganic encapsulation layer. The organic encapsulation layer may have a first side facing the organic light-emitting layer and an opposing side. The flexible display panel may include at least one bending area, where at least one groove may be formed on the opposing side of the at least one organic encapsulation layer. A width W at the bottom (i.e., the bottom width) of the groove may be configured to be $$W \geq \frac{n}{180°}\pi R,$$

where n is a maximum bending angle of the bending area, 0°<n≤180°, and R is a bending radius of the bending area.

Figure 1B:
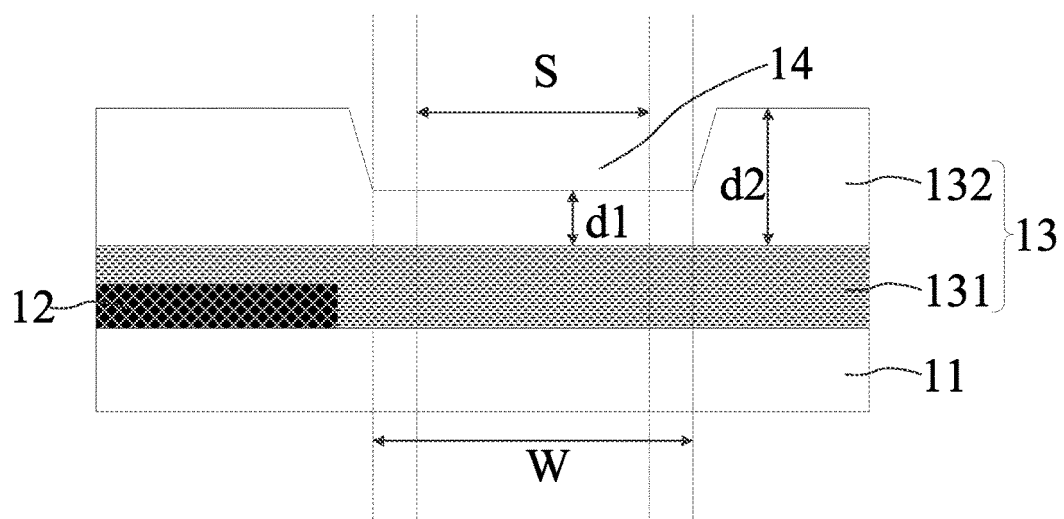
FIG. 1B illustrates a cross-sectional view of an exemplary flexible display panel according to disclosed embodiments.

FIG. 1B illustrates a cross-sectional view of an exemplary flexible display panel according to disclosed embodiments. As shown in FIG. 1B, the flexible display panel may include a flexible substrate 11, an organic light-emitting layer 12 disposed on a side of the flexible substrate 11 and having a first side facing the flexible substrate and an opposing side, and a thin-film-encapsulation layer 13 disposed on the opposing side of the organic light-emitting layer 12. The thin-film-encapsulation layer 13 may include an inorganic encapsulation layer 131 and an organic encapsulation layer 132. The organic encapsulation layer 132 may have a first side facing the organic light-emitting layer 12 and an opposing side.

The flexible display panel may include at least one bending area S. The organic encapsulation layer 132 in the bending area S may be formed with at least one groove 14 on the opposing side. The bottom width W of the groove 14 may be configured to be $$W \geq \frac{n}{180°}\pi R,$$

where n is a maximum bending angle of the bending area, 0°<n≤180°, and R is a bending radius of the bending area.

In the disclosed embodiments, because at least one organic encapsulation layer in the bending area S is formed with at least one groove 14 on the opposing side, the thickness of the flexible display panel at the bending area S may be reduced and, accordingly, the bending stress generated in the bending area S of the flexible display panel may be reduced. Moreover, when the bottom width W of the groove 14 is configured to be $$W \geq \frac{n}{180°}\pi R,$$

the bending stress generated in the bending area S of the flexible display panel may not concentrate at the groove 14 and, accordingly, the intensity of the bending stress may be reduced, and certain portion of the bending stress in the groove 14 may be relieved.

In addition, the disclosed flexible display panel may reduce the bending stress by reducing the thickness of certain sub-layers of the thin-film-encapsulation layer, instead of completely removing certain sub-layers of the thin-film-encapsulation layer in the existing flexible display panel. Thus, the bending stress in the bending area may still be effectively reduced and, meanwhile, ambient moisture and oxygen may be effectively prevented from entering the organic light-emitting layer through the thin-film-encapsulation layer, thereby ensuring the encapsulation of the thin-film-encapsulation layer.

As shown in FIG. 1B, the thin-film-encapsulation layer 13 may include one inorganic encapsulation layer 131 and one organic encapsulation layer 132, which is for illustrative purposes and is not intended to limit the scope of the present disclosure. In another embodiment, the number of the inorganic encapsulation layers and the number of the organic encapsulation layers each may be configured to be greater than 1.

Referring to FIG. 1B, the organic light-emitting layer 12 may include a plurality of organic light-emitting devices arranged in array. The organic light-emitting device may include any appropriate organic light-emitting devices. In one embodiment, the organic light-emitting device may include a first electrode, an organic light-emitting layer, and a second electrode, which are stacked sequentially. A thin-film-transistor layer may be disposed between the organic light-emitting layer 12 and the flexible substrate 11. The thin-film-transistor layer may include a plurality of thin-film-transistors, storage capacitors, data lines, gate lines, power supply voltage lines, and ground lines, etc.

The thin-film-encapsulation layer 13 may be configured to encapsulate the organic light-emitting device and the thin-film-transistors. The thin-film-encapsulation layer 13 may prevent ambient moisture and oxygen from entering the organic light-emitting devices, thereby protecting the organic light-emitting devices. The thin-film-encapsulation layer 13 may also protect the thin-film-transistors.

In one embodiment, the organic encapsulation layer 132 may be made of any one of acrylic, epoxy, and silicone material. The organic encapsulation layer 132 may be formed by an ink jet printing process. The ink jet printing is simple and reliable, through which the organic encapsulation layer 132 may be formed without masks. The inorganic encapsulation layer 131 may be formed by a chemical vapor deposition (CVD) or atomic layer deposition (ALD) process.

Figure 1C:
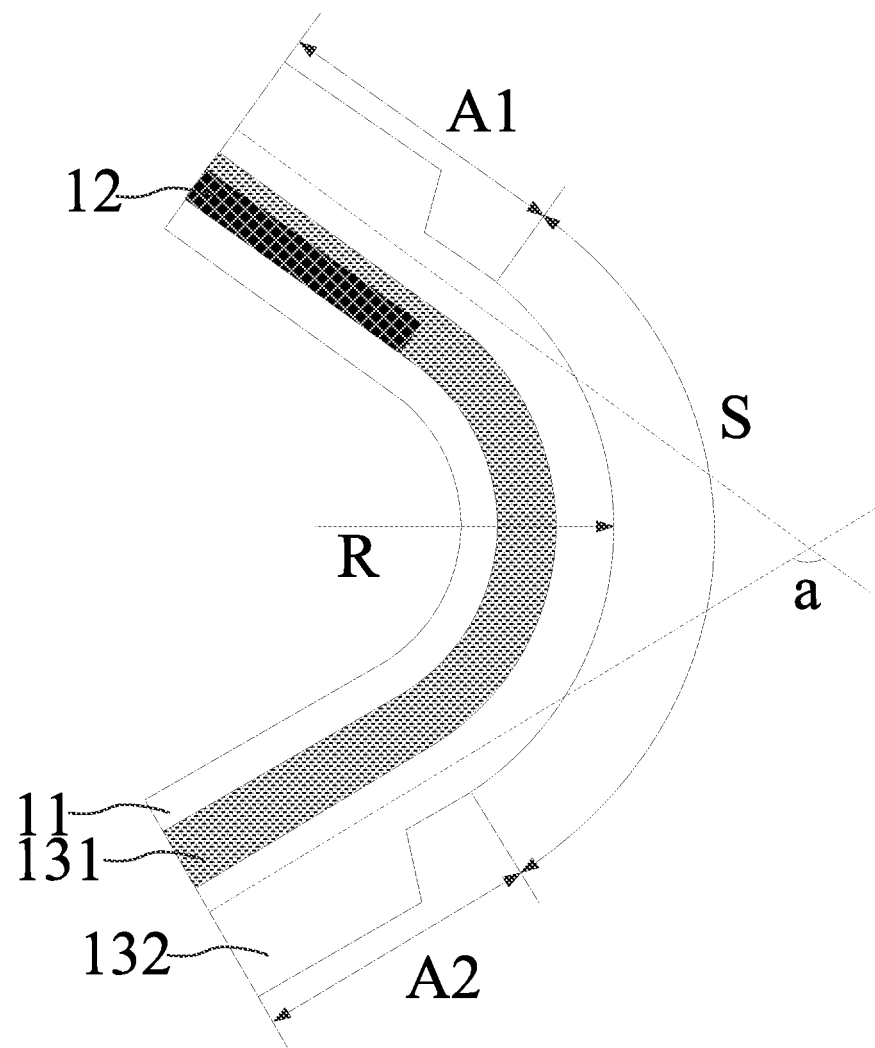
FIG. 1C illustrates a cross-sectional view of an exemplary bent flexible display panel according to disclosed embodiments.

FIG. 1C illustrates a cross-sectional view of an exemplary bent flexible display panel according to disclosed embodiments. As shown in FIG. 1C, the flexible display panel may include three areas, a first area A1, a bending area S, and a second area A2. The bending area S may be located between the first area A1 and the second area A2, and the bending area S may be adjacent to and in contact with the first area A1 and the second area A2. That is, the first area A1 and the second area A2 may be extension areas on both sides of the bending area S.

A bending angle of the bending area S may be defined as a bending angle α of the second area A2 with respect to the first area A1. The bending radius R may be defined as a shortest distance between a center of the circle formed by the bending area S and the bottom of the groove 14. The bending R radius may be greater than or equal to about 0.1 mm. When the bending radius R is smaller than 0.1 mm, the flexible display panel may not be bent easily. Excessive bending stress may occur in the bending area S, thereby increasing the risk of the flexible display panel breakage. When the bending radius R is greater than or equal to 0.1 mm, the bending stress in the bending area S may be substantially small, thereby reducing the risk of the flexible display panel breakage.

Figure 1D:
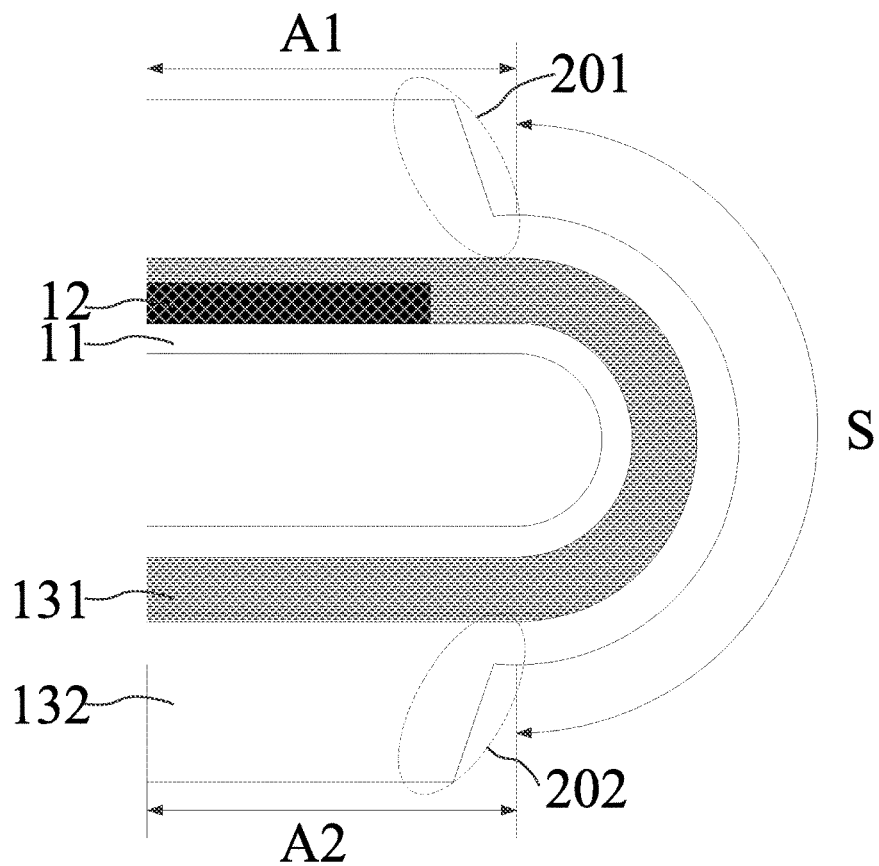
FIG. 1D illustrates a cross-sectional view of another exemplary bent flexible display panel according to disclosed embodiments.

FIG. 1D illustrates a cross-sectional view of another exemplary bent flexible display panel according to disclosed embodiments. As shown in FIG. 1D, the flexible display panel may be bent to a position having a bending angle of about 180° of the bending area S. Because the groove 14 is formed on the organic encapsulation layer 132 and is corresponding to the bending area S, the thickness of the flexible display panel in the bending area S may be reduced, and the bending stress in the bending area S of the flexible display panel may be reduced.

In addition, because the bottom width W of the groove 14 is configured to be $$W \geq \frac{n}{180°}\pi R, \ i.e., \ W \geq \pi R,$$

and a first climbing position 201 and a second climbing position 202 may be located just outside the bending area S, the bending stress in the bending area S may not concentrate at the first climbing position 201 and the second climbing position of the groove 14. Thus, the organic encapsulation layer 132 may be prevented from cracking or breaking at the first climbing position 201 and the second climbing position 202.

The organic encapsulation layer 132 may be disposed in the bending area S. The organic encapsulation layer 132 and the inorganic encapsulation layer 131 disposed in the bending area S may be coordinated to effectively block ambient moisture and oxygen, thereby reducing the bending stress in the bending area S and, meanwhile, ensuring the effective encapsulation of the thin-film-encapsulation layer 13 in the bending area S.

Further, in one embodiment, the width of the bottom of the groove 14 may be configured to W=πR. Because the groove 14 is formed in the bending area S, when the bottom width of the groove 14 is configured to be W=πR, the bottom width of the groove 14 may be equal to a width of the bending area S, thereby reducing the bending stress in the bending area S and, meanwhile, ensuring the effective encapsulation of the thin-film-encapsulation layer 13.

Returning to FIG. 1B, in one embodiment, the organic encapsulation layer 132 formed with the groove 14 may have a thickness d2 of approximately between 2 μm and 40 μm, and the groove 14 may have a thickness d1 of approximately between 1 μm and 20 μm. The organic encapsulation layer 132 may relieve the bending stress generated between the inorganic encapsulation layers 131 and increase invasion paths of moisture and oxygen. However, when the organic encapsulation layer 132 is substantially thick, the neutral plane may be deviated from the organic light-emitting layer 12, damaging the organic light-emitting layer 12 when bending the flexible display panel, and degrading display performance. In addition, when the organic encapsulation layer 132 is substantially thick, the bending radius may increase. Thus, the organic encapsulation layer 132 formed with the groove 14 may be configured to have the thickness d2 of approximately between 2 μm and 40 μm and the groove 14 may be configured to have the thickness d1 of approximately between 1 μm and 20 μm.

Figure 2A:
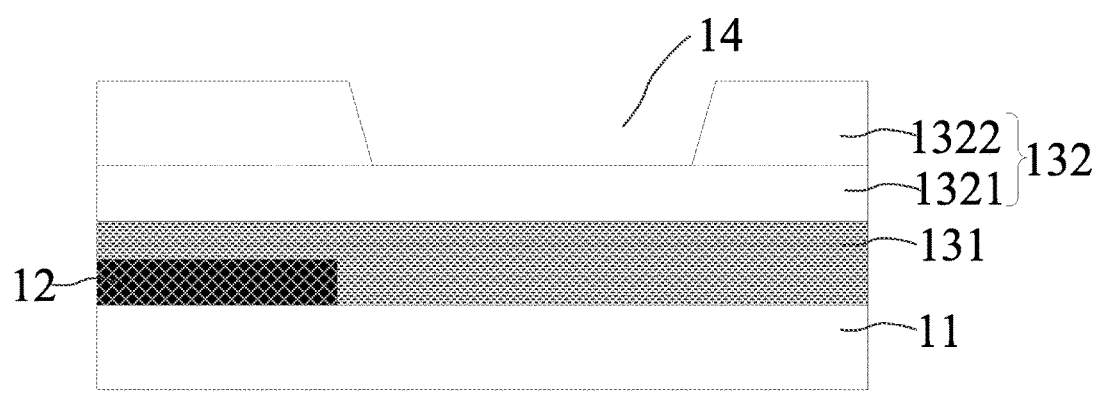
FIG. 2A illustrates a cross-sectional view of another exemplary flexible display panel according to disclosed embodiments.

FIG. 2A illustrates a cross-sectional view of another exemplary flexible display panel according to disclosed embodiments. The similarities between FIG. 2A and FIG. 1B are not repeated here, while certain differences will be explained.

As shown in FIG. 2A, the organic encapsulation layer 132 may further include a first organic encapsulation sub-layer 1321 and a second organic encapsulation sub-layer 1322. The first organic encapsulation sub-layer 1321 may be continuously disposed to cover the entire flexible display panel. The second organic encapsulation sub-layer 1322 may be discontinued in the bending area S, thereby forming at least one groove 14.

Figure 2B:
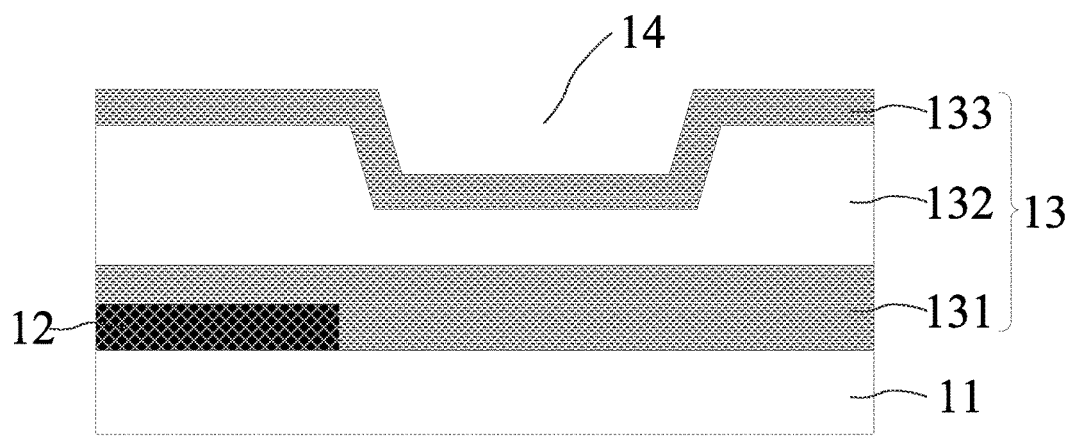
FIG. 2B illustrates a cross-sectional view of another exemplary flexible display panel according to disclosed embodiments.

FIG. 2B illustrates a cross-sectional view of another exemplary flexible display panel according to disclosed embodiments. In another embodiment, as shown in FIG. 2B, the flexible display panel may include a flexible substrate 11, an organic light-emitting layer 12 disposed on a side of the flexible substrate 11 and having a first side facing the flexible substrate and an opposing side, a thin-film-encapsulation layer 13 disposed on the opposing side of the organic light-emitting layer 12. The thin-film-encapsulation layer 13 may include a first inorganic encapsulation layer 131, a second inorganic encapsulation layer 133, and a first organic encapsulation layer 132 disposed between the first inorganic encapsulation layer 131 and the second inorganic encapsulation layer 133. The first inorganic encapsulation layer 131 may be disposed between the organic light-emitting layer 12 and the first organic encapsulation layer 132. The first organic encapsulation layer 132 may be formed with at least one groove 14 in the bending area S.

The first inorganic encapsulation layer 131 and the second inorganic encapsulation layer 133 may easily have cracks when being bent, due to the material properties of inorganic encapsulation layers. Through configuring the first organic encapsulation layer 132 to have at least one groove 14 formed in the bending area S, the bending stress may be reduced. Accordingly, the second inorganic encapsulation layer 133 disposed on the first organic encapsulation layer 132 may be prevented from cracking or breaking caused by excessive bending stress when being bent, and the encapsulation effectiveness of the thin-film-encapsulation layer 13 may be ensured.

Figure 2C:
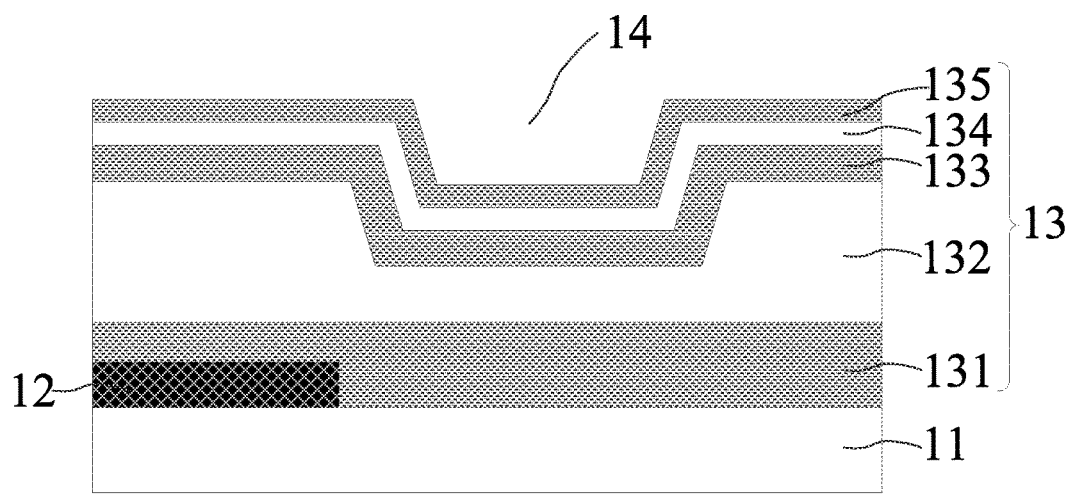
FIG. 2C illustrates a cross-sectional view of another exemplary flexible display panel according to disclosed embodiments.

FIG. 2C illustrates a cross-sectional view of another exemplary flexible display panel according to disclosed embodiments. The similarities between FIG. 2C and FIG. 1B are not repeated here, while certain differences will be explained.

As shown in FIG. 2C, the flexible display panel may include a flexible substrate 11, an organic light-emitting layer 12 disposed on a side of the flexible substrate 11 and having a first side facing the flexible substrate and an opposing side, a thin-film-encapsulation layer 13 disposed on the opposing side of the organic light-emitting layer 12. The thin-film-encapsulation layer 13 may include a first inorganic encapsulation layer 131, a first organic encapsulation layer 132, a second inorganic encapsulation layer 133, a second organic encapsulation layer 134, and a third inorganic encapsulation layer 135.

Either the first organic encapsulation layer 132 or the second organic encapsulation layer 134 may be configured with at least one groove 14 in the bending area S, such that the bending stress may be reduced, and at least one of the second inorganic encapsulation layer 133 disposed on the first organic encapsulation layer 132 and the third inorganic encapsulation layer 135 disposed on the second organic encapsulation layer 134 may be prevented from cracking or breaking caused by an excessive bending stress when being bent. Employing three inorganic encapsulation layers and two organic encapsulation layers may ensure the encapsulation effectiveness of the thin-film-encapsulation layer 13, and may improve the life span of the flexible display panel.

Figure 3A:
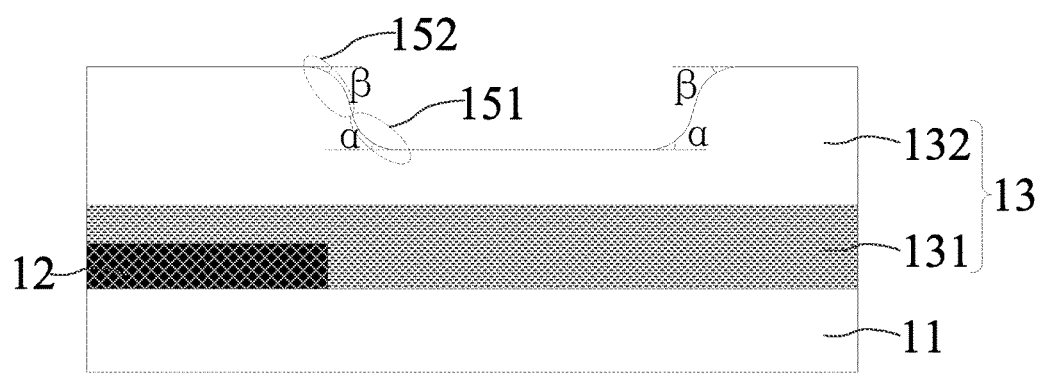
FIG. 3A illustrates a cross-sectional view of another exemplary flexible display panel according to disclosed embodiments.

FIG. 3A illustrates a cross-sectional view of another exemplary flexible display panel according to disclosed embodiments. The similarities between FIG. 3A and FIG. 1B are not repeated here, while certain differences will be explained.

As shown in FIG. 3A, the flexible display panel may further include at least one of a first curved line 151 and a second curved line 152. The first curved line 151 may be disposed transitioning between the bottom of the groove 14 and the side wall of the groove 14, and the second curved line 152 may be disposed transitioning between the side wall of the groove 14 and the non-recessed surface of the organic encapsulation layer 132.

The transition between the bottom of the groove 14 and the side wall of the groove 14 may be smoothed through the first curved line 151. When being bent, the bending stress at the bottom and on the side wall of the groove 14 may be further reduced. Thus, the risk of cracks in the organic encapsulation layer 132 may be further reduced, and the bending performance of the flexible display panel when being bent may be improved.

An angle α formed between the first curved line 151 and the bottom of the groove 14 may be determined according to various application scenarios. In one embodiment, the angle α formed between the first curved line 151 and the bottom of the groove 14 may be greater than about 0° and smaller than or equal to about 70°, i.e., $0°<\alpha \leq 70°$. In another embodiment, the angle α formed between the first curved line 151 and the bottom of the groove 14 may be greater than about 15° and smaller than or equal to about 70°, i.e., $15°<\alpha \leq 70°$. When the angle α formed between the first curved line 151 and the bottom of the groove 14 is large, for example, greater than about 70° and smaller than or equal to about 90°, a substantially large bending stress may be generated when the flexible display panel is bent. The bending stress may likely concentrate in the groove 14, thereby causing the groove 14 to crack or break.

When the angle α formed between the first curved line 151 and the bottom of the groove 14 is sustainably small, the bottom width of the groove 14 may be sustainably wide, and the groove 14 may extend into the display area of the flexible display panel, thereby causing the light emitted from the display area to refract and reflect and degrading the display performance of the flexible display panel. Thus, the angle α formed between the first curved line 151 and the bottom of the groove 14 may be configured to be approximately greater than about 15° and smaller than or equal to about 70°, i.e., $15°<\alpha \leq 70°$.

Similarly, an angle β formed between the second curved line 152 and the non-recessed surface of the organic encapsulation layer 132 may be determined according to various application scenarios. In one embodiment, the angle β formed between the second curved line 152 and the non-recessed surface of the organic encapsulation layer 132 may be greater than about 0° and smaller than or equal to about 60°, i.e., $0°<\beta \leq 60°$. In another embodiment, the angle β formed between the second curved line 152 and the non-recessed surface of the organic encapsulation layer 132 may be greater than about 15° and smaller than or equal to about 70°, i.e., $15°<\beta \leq 70°$. When the angle β formed between the second curved line 152 and the non-recessed surface of the organic encapsulation layer 132 is large, for example, greater than about 70° and smaller than or equal to about 90°, a substantially large bending stress may be generated when the flexible display panel is bent. The bending stress may likely concentrate in the groove 14, thereby causing the groove 14 to crack or break.

When the angle β formed between the second curved line 152 and the non-recessed surface of the organic encapsulation layer 132 is substantially small, the bottom width of the groove 14 may be wide, and the groove 14 may extend into the display area of the flexible display panel, thereby causing the light emitted from the display area to refract and reflect, and degrading the display performance of the flexible display panel. Thus, the angle β formed between the second curved line 152 and the non-recessed surface of the organic encapsulation layer 132 may be configured to be greater than about 15° and smaller than or equal to about 45°, i.e., $15°<\beta \leq 45°$.

In the disclosed embodiments, one bending area may include a plurality of grooves. That is, a plurality of grooves may be disposed in the same bending area. When the plurality of the grooves is configured in the same bending area, the plurality of the grooves may be arranged in parallel in a direction perpendicular to an extension direction of the groove. An exemplary structure is shown in FIG. 3B.

Figure 3B:
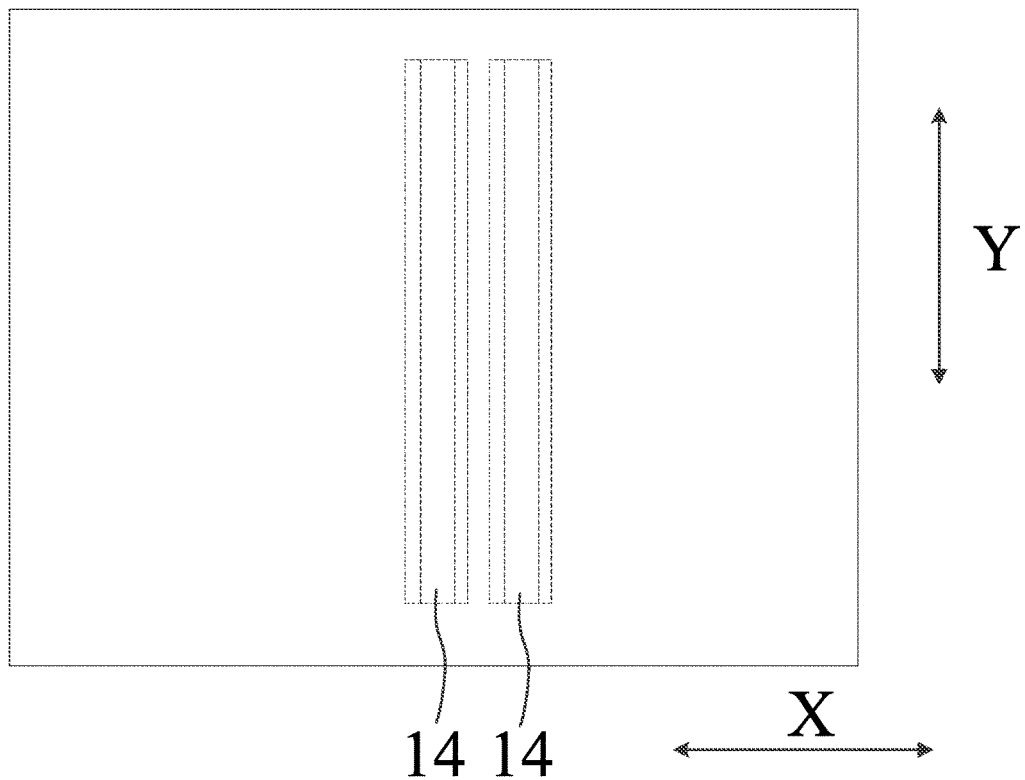
FIG. 3B illustrates a top view of another exemplary flexible display panel according to disclosed embodiments.

FIG. 3B illustrates a top view of another exemplary flexible display panel according to disclosed embodiments. As shown in FIG. 3B, one bending area of the flexible display panel may include two grooves 14. The grooves 14 may extend in a direction Y. The two grooves 14 may be arranged in parallel in a direction X. The direction X may be perpendicular to the extension direction Y of grooves 14. The number of the grooves 14, the directions X and Y in FIG. 3B are for illustrative purposes and are not intended to limit the scope of the present disclosure.

The flexible display panel may include a display area and a non-display area surrounding the display area. At least one of the display area and the non-display area may be configured with at least one bending area. The display area may be an area for image display, and the non-display area may be an area not for image display.

Further, the non-display area of the flexible display panel may be disposed with a peripheral circuit. An orthogonal projection of the peripheral circuit onto the flexible substrate may partially overlap with an orthogonal projection of the bending area onto the flexible substrate. An exemplary structure is shown in FIG. 4A.

Figure 4A:
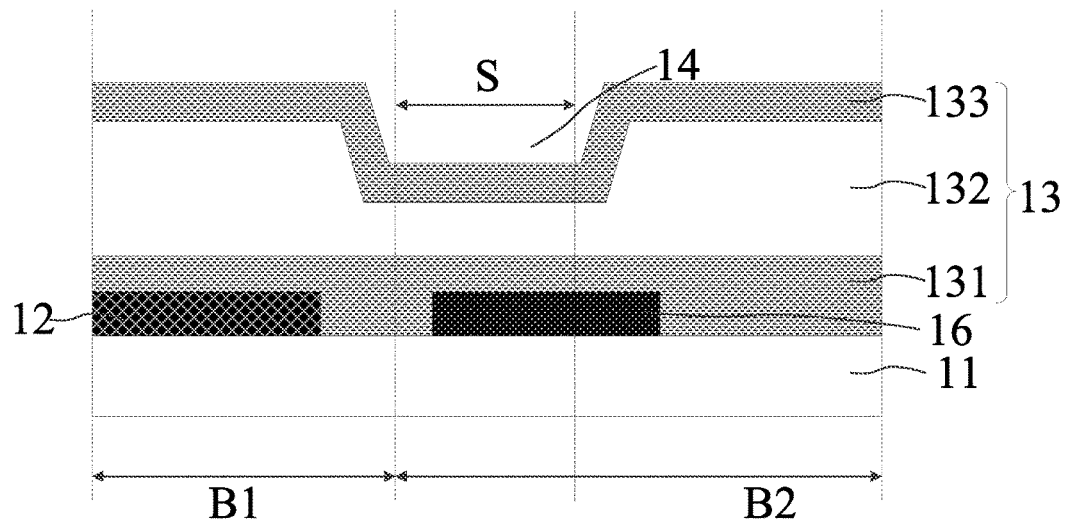
FIG. 4A illustrates a cross-sectional view of another exemplary flexible display panel according to disclosed embodiments.

FIG. 4A illustrates a cross-sectional view of another exemplary flexible display panel according to disclosed embodiments. As shown in FIG. 4A, the flexible display panel may include a display area B1 and a non-display area B2. The non-display area B2 of the flexible display panel may be configured with a peripheral circuit 16. An orthogonal projection of the peripheral circuit 16 onto the flexible substrate 11 may partially overlap with an orthogonal projection of the bending area S onto the flexible substrate 11. Thus, the bending area S may not separately occupy the non-display area B2 of the flexible display panel, thereby facilitating a narrow frame design of the flexible display panel.

The peripheral circuit may include thin-film-transistors and metal wirings. That is, the bending area S may bend downwards from the edge of the display area B1, and may be located in the non-display area B2. In various practical applications, after the bending area S is bent, the non-display area B2 may become a side wall of the flexible display panel. When the flexible display panel is incorporated in a display apparatus, the bending area S may be bent, such that the non-display area B2 may become a side wall of the display apparatus, or the non-display area B2 may be folded to the back wall of the display area B1. Thus, a borderless design of the display apparatus may be achieved, and non-display area B2 may be called an edge area or border area.

Figure 4B:
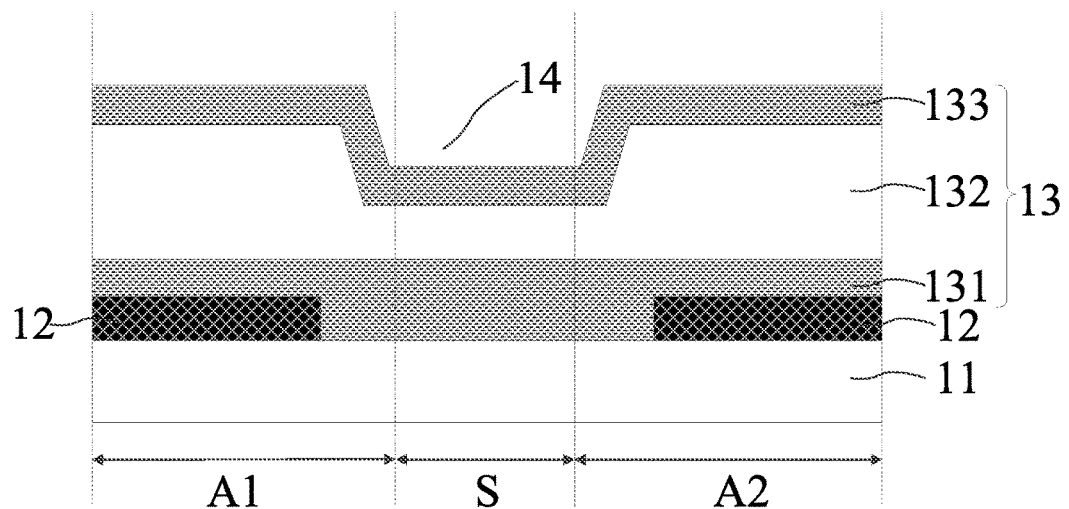
FIG. 4B illustrates a cross-sectional view of another exemplary flexible display panel according to disclosed embodiments.

FIG. 4B illustrates a cross-sectional view of another exemplary flexible display panel according to disclosed embodiments. In one embodiment, as shown in FIG. 4B, the flexible display panel may include a flexible substrate 11, an organic light-emitting layer 12 disposed on a side of the flexible substrate 11 and having a first side facing the flexible substrate and an opposing side, and a thin-film-encapsulation layer 13 disposed on the opposing side of the organic light-emitting layer 12. The thin-film-encapsulation layer 13 may include a first inorganic encapsulation layer 131, a second inorganic encapsulation layer 133, and a first organic encapsulation layer 132. The first organic encapsulation layer 132 may be disposed between the first inorganic encapsulation layer 131 and the second inorganic encapsulation layer 133. The first inorganic encapsulation layer 131 may be disposed between the organic light-emitting layer 12 and the first organic encapsulation layer 132. The first organic encapsulation layer 132 may be configured with at least one groove 14 in the bending area S.

The flexible display panel may also include a display area. The display area may include a first display area A1 and a second display area A2. Both the first display area A1 and the second display area A2 may be located adjacent to the bending area S. The bending area S may be disposed between the first display area A1 and the second display area A2. That is, the bending area S may also be located in the display area. However, the bending area S may be located in a non-light-emitting area of the display area.

In particular, an orthogonal projection of the groove 14 on the organic light-emitting layer 12 may be located between two adjacent rows or two adjacent columns of sub-pixels. That is, in a direction perpendicular to the flexible display panel, the thin-film-encapsulation layer 13 in the area of sub-pixels may not be configured with any groove 14. Thus, the area of sub-pixels in the thin-film-encapsulation layer 13 may be substantially flat, such that the optical properties of the sub-pixels by the groove 14 may not be degraded by the groove 14.

In another embodiment, as shown in FIG. 4B, the flexible display panel may include a flexible substrate 11, an organic light-emitting layer 12 disposed on a side of the flexible substrate 11 having a first side facing the flexible substrate and an opposing side, and a thin-film-encapsulation layer 13 disposed on the opposing side of the organic light-emitting layer 12. The thin-film-encapsulation layer 13 may include a first inorganic encapsulation layer 131, a second inorganic encapsulation layer 133, and a first organic encapsulation layer 132. The first organic encapsulation layer 132 may be disposed between the first inorganic encapsulation layer 131 and the second inorganic encapsulation layer 133. The first inorganic encapsulation layer 131 may be disposed between the organic light-emitting layer 12 and the first organic encapsulation layer 132. The first organic encapsulation layer 132 may be configured with at least one groove 14 in the bending area S.

The flexible display panel may also include a first display area A1 and a second display area A2. The first display area A1 and the second display area A2 may display different images. The bending area S may be disposed between the first display area A1 and the second display area A2. That is, the bending area S may bend downwards from an edge of the first display area A1. The bending area S may be a non-display area. The second display area A2 may be an area extended outward from the bending area S. In various practical applications, when the flexible display panel is incorporated in a display apparatus, the flexible display panel may display different images in the first display area A1 and the second display area A2. Thus, the display apparatus may be a double-sided display apparatus.

Figure 4C:
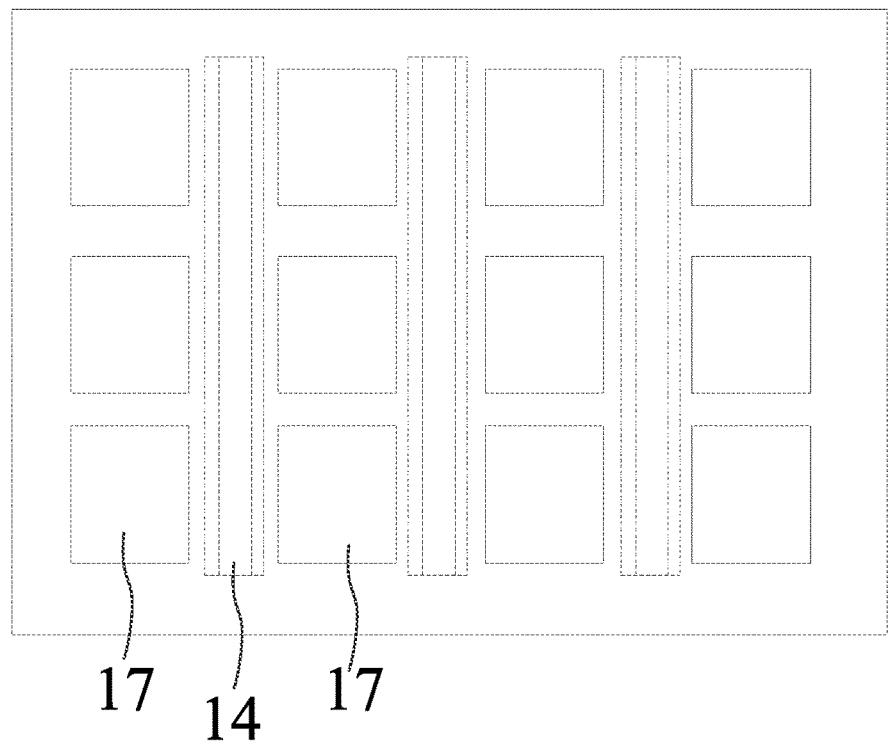
FIG. 4C illustrates a top view of another exemplary flexible display panel according to disclosed embodiments.

FIG. 4C illustrates a top view of another exemplary flexible display panel according to disclosed embodiments. As shown in FIG. 4C, a plurality of grooves 14 may be disposed between two adjacent columns of pixels 17. The groove 14 may be arranged in a straight line in an extension direction of the groove 14. That is, the groove 14 may have a straight line shape.

Figure 4D:
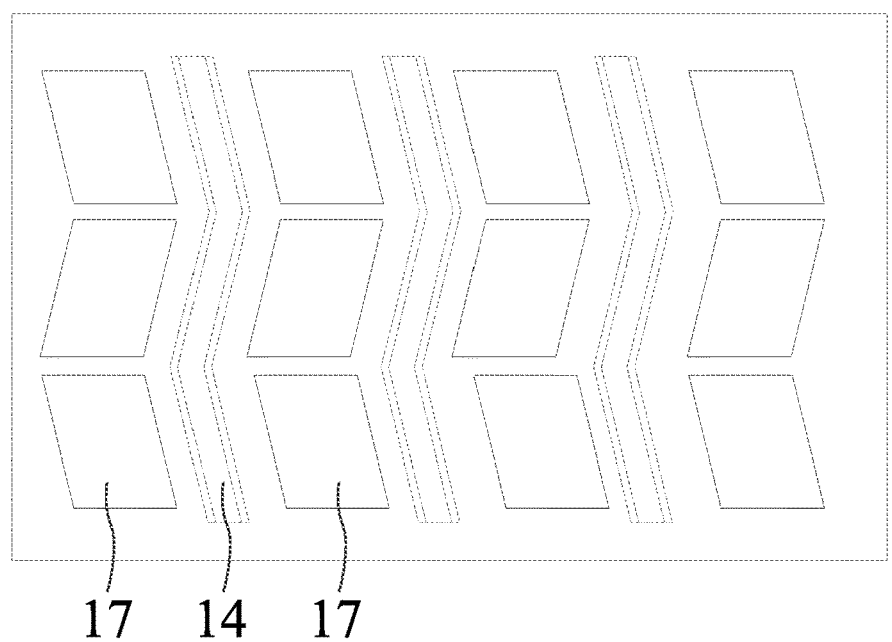
FIG. 4D illustrates a top view of another exemplary flexible display panel according to disclosed embodiments.

FIG. 4D illustrates a top view of another exemplary flexible display panel according to disclosed embodiments. As shown in FIG. 4D, a plurality of grooves 14 may be disposed between any two adjacent columns of pixels 17. The groove 14 may be arranged in a folded line in an extension direction of the groove 14. That is, the groove 14 may have a folded line shape.

The arrangement and the shape of the grooves 14 in FIG. 4C and FIG. 4D are for illustrative purposes and are not intended to limit the scope of the present disclosure.

In practical applications, the grooves 14 may be arranged in a way adapting to the shape and arrangement of the pixels.

Figure 5:
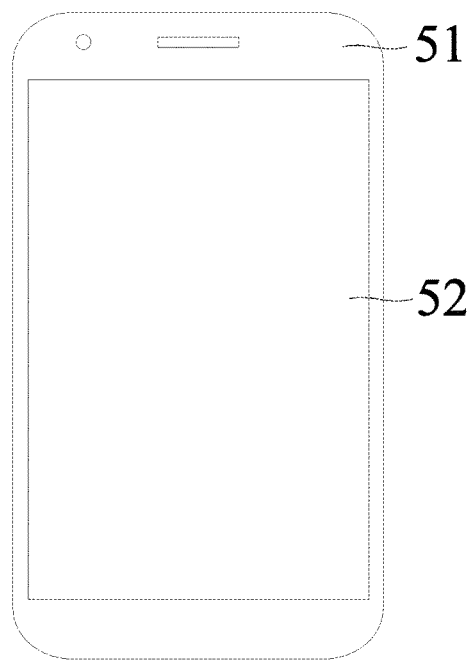
FIG. 5 illustrates a schematic view of an exemplary display apparatus according to disclosed embodiments.

The present disclosure also provides a display apparatus. The display apparatus may include a disclosed flexible display panel. FIG. 5 illustrates a schematic view of an exemplary display apparatus according to disclosed embodiments. As shown in FIG. 5, the display apparatus 51 may include a flexible display panel 52. The flexible display panel 52 may be any one of the disclosed flexible display panels. Although a smart phone is shown in FIG. 16, the touch control display apparatus 1 may be a smart watch, a VR goggle, a smart hand band, an electronic paper, a television set, an automotive display, a notebook computer, a tablet computer, or any appropriate touch control display apparatus, which is not limited by the present disclosure.

Figure 6A:
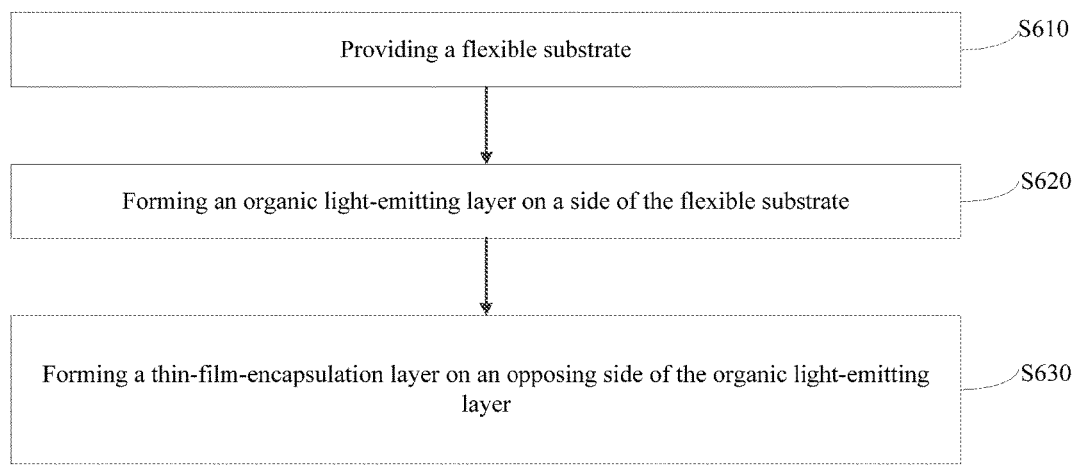
FIG. 6A illustrates a flow chart of an exemplary flexible display panel fabrication method according to disclosed embodiments.
Figure 6B:
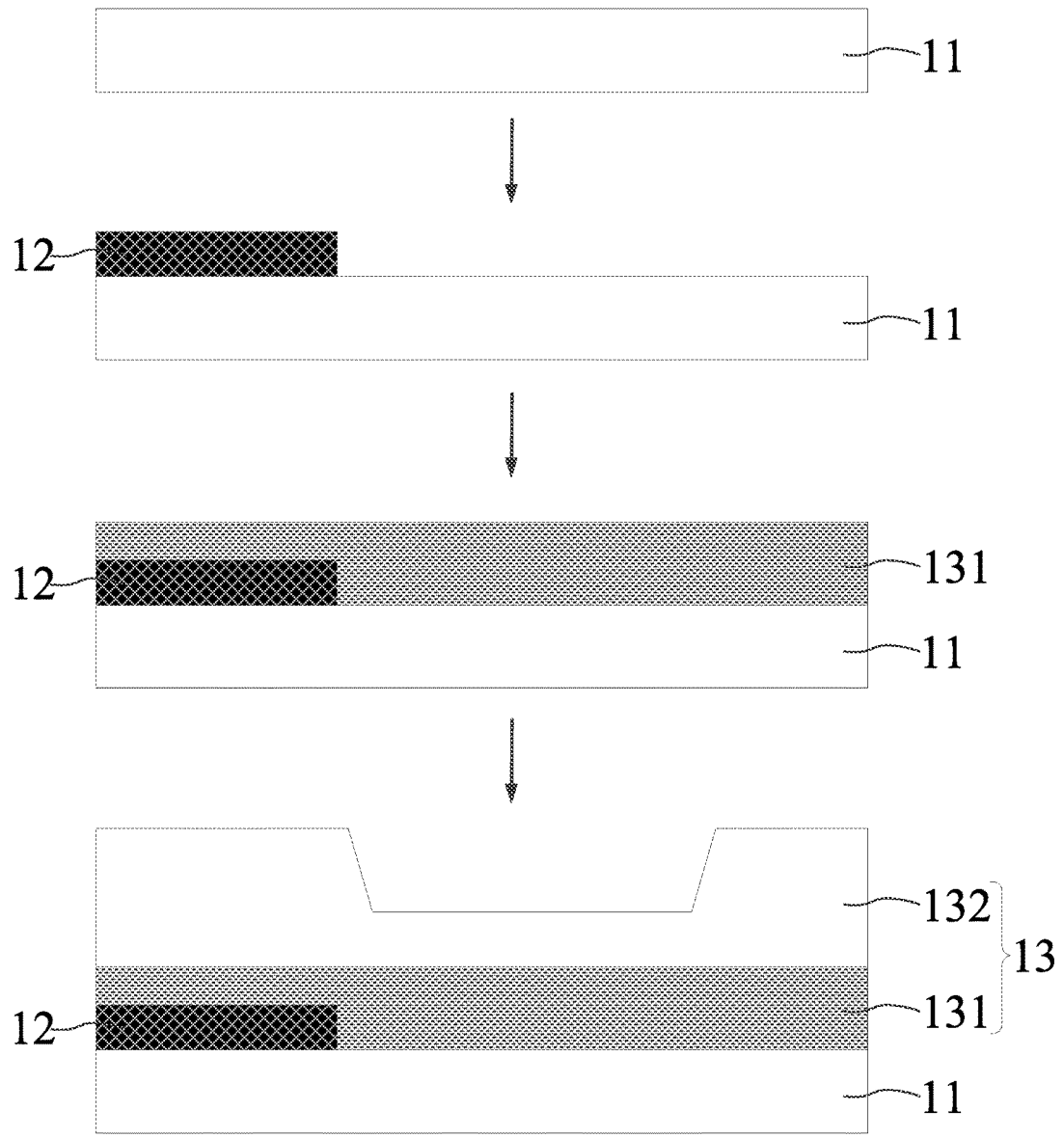
FIG. 6B illustrates cross-sectional views of an exemplary flexible display panel corresponding to each step of an exemplary fabrication method according to disclosed embodiments.

FIG. 6A illustrates a flow chart of an exemplary fabrication method for an exemplary flexible display panel according to disclosed embodiments. FIG. 6B illustrates cross-sectional views of an exemplary flexible display panel corresponding to each step of an exemplary fabrication method according to disclosed embodiments. As shown in FIG. 6A, at the beginning, a flexible substrate is provided (S610). After the flexible substrate is provided, an organic light-emitting layer is formed on the flexible substrate (S620). The corresponding structure is shown in FIG. 6B.

As shown in FIG. 6B, the organic light-emitting layer 12 may be formed by sputtering, vapor deposition, or similarly appropriate processes. In particular, through sputtering or vapor deposition, a first electrode of an organic light-emitting device may be formed in the organic light-emitting layer 12 on the flexible substrate 11. The first electrode may have a first side facing the flexible substrate and an opposing side. After the first electrode is formed, through sputtering or vapor deposition, an organic light-emitting material layer may be formed on the opposing side of the first electrode. The organic light-emitting material layer may have a first side facing the flexible substrate and an opposing side. After the organic light-emitting material layer is formed, through sputtering or vapor deposition, a second electrode may be formed on the opposing side of the organic light-emitting material layer. The first electrode or the second electrode may be a transparent electrode, a semi-transparent electrode, or a reflective electrode.

Returning to FIG. 6A, after the organic light-emitting layer is formed on the flexible substrate, the organic light-emitting layer has a first side facing the flexible substrate and an opposing side, a thin-film-encapsulation layer is formed on the opposing side of the organic light-emitting of the flexible substrate(S630). The corresponding structure is shown in FIG. 6B.

As shown in FIG. 6B, the organic light-emitting layer 12 may have a first side facing the flexible substrate 11 and an opposing side. The thin-film-encapsulation layer 13 may be formed on the opposing side of the organic light-emitting layer 12. The thin-film-encapsulation layer 13 may include at least one organic encapsulation layer 132 and at least one inorganic encapsulation layer 131. The organic encapsulation layer 132 may have a first side facing the flexible substrate 11 and an opposing side. The inorganic encapsulation layer 131 may have a first side facing the flexible substrate 11 and an opposing side. The fabricated flexible display panel may include at least one bending area. At least one groove may be formed on the opposing side of at least one organic encapsulation layer 132 in the bending area.

A bottom width W of the groove may be configured to be $$W \geq \frac{n}{180°}\pi R,$$

where n is a maximum bending angle of the bending area, $0° < n \leq 180°$, and R is a bending radius of the bending area. In one embodiment, the bottom width W of the groove may be configured to be $W = \pi R$.

In the disclosed embodiments, the organic encapsulation layer 132 may formed by an ink jet printing process. The organic encapsulation layer 132 may be formed together with the groove by the same ink jet printing process. The inorganic encapsulation layer 131 may be formed by a chemical vapor deposition (CVD) process or an atomic layer deposition (ALD) process.

Figure 6C:
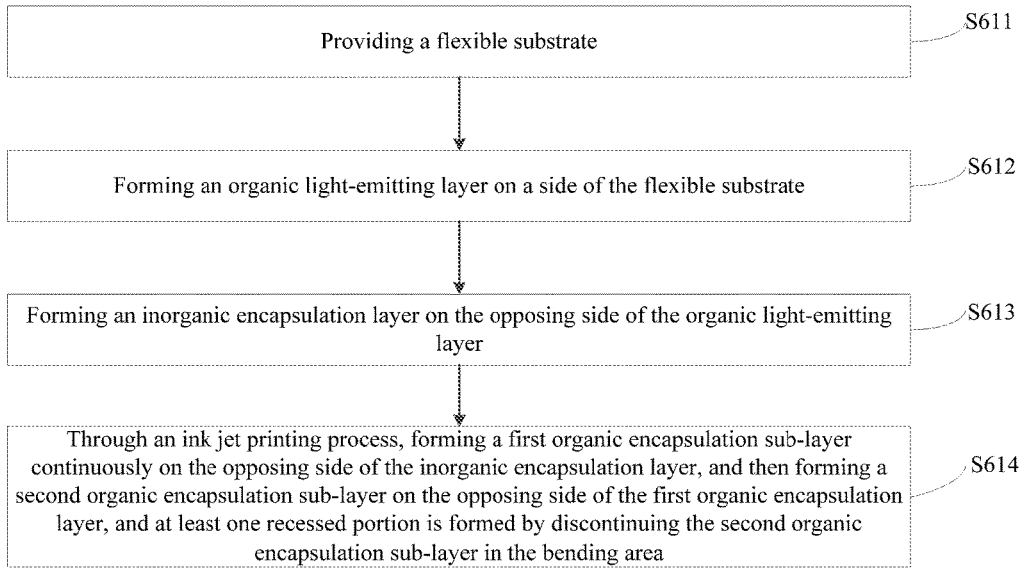
FIG. 6C illustrates a flow chart of another exemplary flexible display panel fabrication method according to disclosed embodiments.

FIG. 6C illustrates a flow chart of another exemplary fabrication method for an exemplary flexible display panel according to disclosed embodiments. The corresponding structure is shown in FIG. 6B. The similarities between FIG. 6C and FIG. 6A are not repeated here, while certain differences will be explained.

As shown in FIG. 6C, at the beginning, a flexible substrate is provided (S611). After the flexible substrate is provided, an organic light-emitting layer is formed on a side of the flexible substrate (S612). After the organic light-emitting layer is formed on the flexible substrate, an inorganic encapsulation layer is formed on the opposing side of the organic light-emitting layer (S613). After the inorganic encapsulation layer is formed on the organic light-emitting layer, through ink jet printing, a first organic encapsulation sub-layer is formed continuously on the opposing side of the inorganic encapsulation layer, and then a second organic encapsulation sub-layer is formed on the opposing side of the first organic encapsulation layer, and at least one groove is formed by discontinuing the second organic encapsulation sub-layer in the bending area (S614).

The inorganic encapsulation layer may be disposed between the organic light-emitting layer and the first organic encapsulation sub-layer.

Figure 6D:
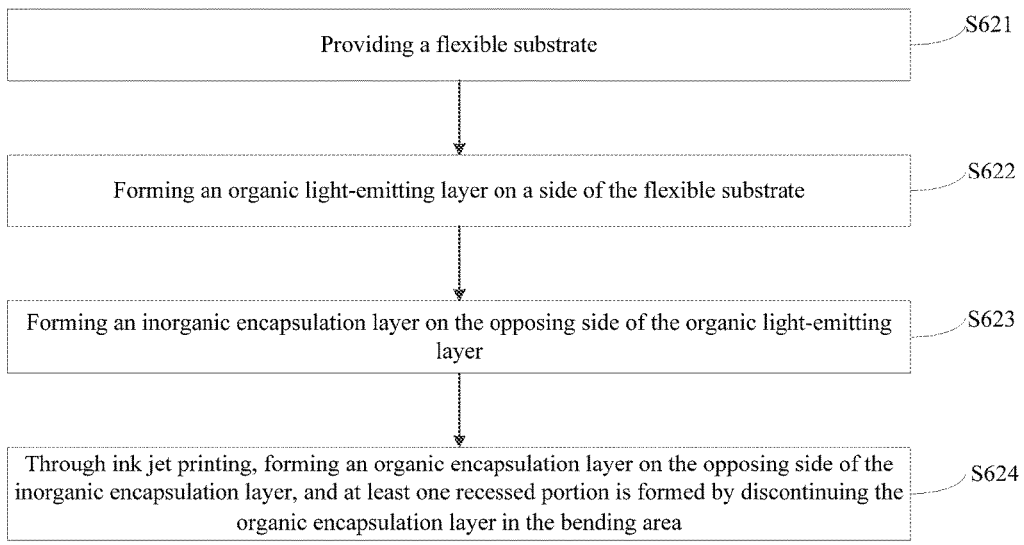
FIG. 6D illustrates a flow chart of another exemplary flexible display panel fabrication method according to disclosed embodiments.

FIG. 6D illustrates a flow chart of another exemplary fabrication method for an exemplary flexible display panel according to disclosed embodiments. The corresponding structure is shown in FIG. 6B. The similarities between FIG. 6D and FIG. 6A are not repeated here, while certain differences will be explained.

As shown in FIG. 6D, at the beginning, a flexible substrate is provided (S621). After the flexible substrate is provided, an organic light-emitting layer is formed on a side of the flexible substrate (S622). After the organic light-emitting layer is formed on the flexible substrate, an inorganic encapsulation layer is formed on opposing side of the organic light-emitting layer (S623). After the inorganic encapsulation layer is formed on the organic light-emitting layer, through ink jet printing, an organic encapsulation layer is formed on the opposing side of the inorganic encapsulation layer, and at least one groove is formed by discontinuing the organic encapsulation layer in the bending area (S624).

The inorganic encapsulation layer may be disposed between the organic light-emitting layer and the organic encapsulation layer. Through ink jet printing, the organic encapsulation layer and at least one groove may be formed at the same time.

In the disclosed embodiments, for example, as shown in FIG. 2A-6D, the display panel may comprise a flexible substrate, an organic light-emitting layer disposed on a side of the flexible substrate and having a first side facing the flexible substrate and an opposing side, and a thin-film-encapsulation layer disposed on the opposing side of the organic light-emitting layer. The thin-film-encapsulation layer may include at least one organic encapsulation layer and at least one inorganic encapsulation layer. The organic encapsulation layer may have a first side facing the organic light-emitting layer and an opposing side. The flexible display panel may include at least one bending area, where at least one groove may be formed on the opposing side of the at least one organic encapsulation layer. A width W at the bottom (i.e., the bottom width) of the groove may be configured to be $$W \geq \frac{n}{180°}\pi R,$$

where n is a maximum bending angle of the bending area, $0° < n \leq 180°$, and R is a bending radius of the bending area.

Because the organic encapsulation layer is substantially thick, through configuring at least one groove on the opposing side of at least one organic encapsulation layer in the bending region and, meanwhile, configuring the width W of the bottom surface of the groove to be $$W \geq \frac{n}{180°}\pi R,$$

the thickness of the flexible display panel may be reduced in at least a part of the bending area, and the film layers in the bending area may get closer to the neutral surface. Accordingly, the bending stress generated at the bending area of the flexible display panel may be reduced, and the encapsulation effect of the thin-film-encapsulation layer may be ensured.

In the thin-film-encapsulation layer, the inorganic encapsulation layer often has excellent moisture and oxygen barrier properties but is substantially rigid. The organic encapsulation layer has poorer moisture and oxygen barrier properties than the inorganic encapsulation layer but is able to eliminate the stress generated by the inorganic encapsulation layer. Due to the material properties of the inorganic encapsulation layers in the thin-film-encapsulation layer, the inorganic encapsulation layer may easily have cracks when being bent.

The present disclosure further provides a flexible display panel where at least one groove may be formed on at least one inorganic encapsulation layer in the bending area, thereby preventing the inorganic encapsulation layer from having cracks when being bent.

The display panel may comprise a flexible substrate, an organic light-emitting layer disposed on a side of the flexible substrate and having a first side facing the flexible substrate and an opposing side, and a thin-film-encapsulation layer disposed on the opposing side of the organic light-emitting layer. The thin-film-encapsulation layer may include at least one organic encapsulation layer and at least one inorganic encapsulation layer. The inorganic encapsulation layer may have a first side facing the organic light-emitting layer and an opposing side. The flexible display panel may include at least one bending area, and at least one groove may be formed on the opposing side of the at least one organic encapsulation layer in the bending area. A width W at the bottom (i.e., the bottom width) of the groove may be configured to be $$W \geq \frac{n}{180°}\pi R,$$

where n is a maximum bending angle of the bending area, 0°<n≤180°, and R is a bending radius of the bending area.

Figure 7A:
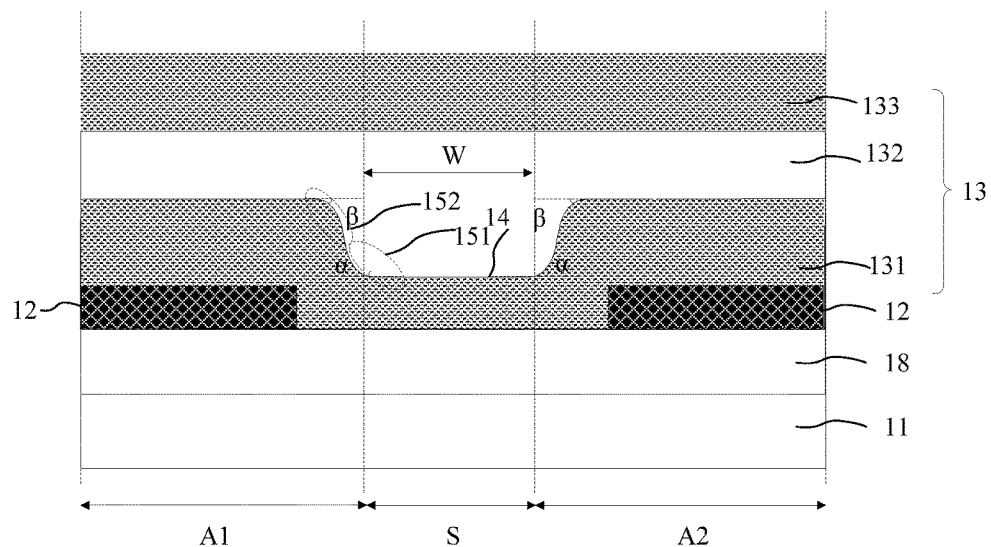
FIG. 7A illustrates a cross-sectional view of another exemplary flexible display panel according to disclosed embodiments.

FIG. 7A illustrates a cross-sectional view of another exemplary flexible display panel according to disclosed embodiments.

As shown in FIG. 7A, the flexible display panel may include a flexible substrate 11, an organic light-emitting layer 12, and a thin-film-encapsulation layer 13. The organic light-emitting layer 12 may be disposed on a side the flexible substrate 11. The organic light-emitting layer 12 may have a first side facing the flexible substrate and an opposing side, and thin-film-encapsulation layer 13 may be disposed on the opposing side of the organic light-emitting layer 12.

The thin-film-encapsulation layer 13 may include at least one organic encapsulation layer and at least one inorganic encapsulation layer. The at least one inorganic encapsulation layer may have a first side facing the organic light-emitting layer and an opposing side. At least one bending area may be disposed on the opposing side of the at least one inorganic encapsulation layer.

The bottom width W of the groove 14 may be configured to be $$W \geq \frac{n}{180°}\pi R,$$

where n is a maximum bending angle of the bending area, 0°<n≤180°, and R is a bending radius of the bending area. In one embodiment, bottom width W of the groove 14 may be configured to be W≥πR.

In the disclosed embodiments, because at least one inorganic encapsulation layer in the bending area S is formed with at least one groove 14 on the opposing side, the thickness of the flexible display panel at the bending area S may be reduced, and the bending stress generated in the bending area S of the flexible display panel may be reduced. Thus, the risk of cracks or even breaks in the flexible display panel and, more particular, in the inorganic encapsulation layer of the thin film encapsulation layer, may be reduced. Moreover, when the bottom width W of the groove 14 is configured to be $$W \geq \frac{n}{180°}\pi R,$$

the bending stress generated in the bending area S of the flexible display panel may not concentrate at the groove 14 and, accordingly, the intensity of the bending stress may be reduced, and certain portion of the bending stress in the groove 14 may be relieved.

In one embodiment, the bottom width W of the groove 14 may be configured to be W≥πR, such that corners of the groove 14 may be arranged outside the bending area S, and the stress may be prevented from being concentrated at the corners of the groove 14. Accordingly, cracks and breaks may be suppressed at the corners of the groove 14.

In one embodiment, as shown in FIG. 7A, the thin-film-encapsulation layer 13 may include a first inorganic encapsulation layer 131, a second inorganic encapsulation layer 133, and a first organic encapsulation layer 132. The first organic encapsulation layer 132 may be disposed between the first inorganic encapsulation layer 131 and the second inorganic encapsulation layer 133. The first inorganic encapsulation layer 131 may be disposed between the thin-film-transistor layer 18 and the first organic encapsulation layer 132. The flexible display panel may include at least one bending area S. The first inorganic encapsulation layer 131 may have a first side facing the flexible substrate 11 and an opposing side, and at least groove 14 may be disposed on the opposing side of the first inorganic encapsulation layer 131 in the bending area S.

In addition, the flexible panel may further include a thin-film-transistor layer 18 disposed between the organic light-emitting layer 12 and the flexible substrate 11. The thin-film-transistor layer 18 may include a plurality of thin-film-transistors (TFT), storage capacitors, data lines, gate lines, power supply voltage lines, and ground lines, etc. In particular, the data lines, gate lines, power supply voltage lines, and ground lines may be disposed in a wiring region in the thin-film-transistor layer 18. The TFT may drive a corresponding organic light-emitting device to emit light, thereby displaying images. The thin-film-encapsulation layer 13 may be configured to encapsulate the organic light-emitting device and the thin-film-transistors and, meanwhile, prevent ambient moisture and oxygen from entering the organic light-emitting devices, thereby protecting the organic light-emitting devices.

The first inorganic encapsulation layer 131 and the second inorganic encapsulation layer 133 may easily have cracks when being bent, due to the material properties of inorganic encapsulation layers. Through configuring the first inorganic encapsulation layer 131 with at least one groove 14 formed in the bending area S, the thickness of the flexible display panel at the bending area S may be reduced, and the bending stress may be reduced. Accordingly, the first inorganic encapsulation layer 131 may be prevented from cracking or breaking caused by excessive bending stress when being bent, the bending reliability of the flexible display panel may be enhanced, and the encapsulation effectiveness of the thin-film-encapsulation layer 13 may be ensured.

In certain embodiments, one bending area may include a plurality of grooves. That is, a plurality of grooves may be disposed in the same bending area. When the plurality of the grooves is configured in the same bending area, the plurality of the grooves may be arranged in parallel in a direction perpendicular to an extension direction of the groove.

The flexible display panel may also include a display area. The display area may include a first display area A1 and a second display area A2. Both the first display area A1 and the second display area A2 may be located adjacent to the bending area S. The bending area S may be disposed between the first display area A1 and the second display area A2. That is, the bending area S may also be located in the display area. However, the bending area S may be located in a non-light-emitting area of the display area.

In particular, an orthogonal projection of the groove 14 on the organic light-emitting layer 12 may be located between two adjacent rows or two adjacent columns of sub-pixels. That is, in a direction perpendicular to the flexible display panel, the thin-film-encapsulation layer 13 may not be configured with any groove 14 in the area of sub-pixels. Thus, the area of sub-pixels in the thin-film-encapsulation layer 13 may be substantially flat, such that the optical properties of the sub-pixels by the groove 14 may not be degraded by the groove 14.

In one embodiment, the first display area A1 and the second display area A2 may display different images. The bending area S may be disposed between the first display area A1 and the second display area A2. That is, the bending area S may bend downwards from an edge of the first display area A1. The bending area S may be a non-display area. The second display area A2 may be an area extended outward from the bending area S. In various practical applications, when the flexible display panel is incorporated in a display apparatus, the flexible display panel may display different images in the first display area A1 and the second display area A2. Thus, the display apparatus may be a double-sided display apparatus.

Referring to FIG. 7A, the flexible display panel may further include at least one of a first curved line 151 and a second curved line 152. The first curved line 151 may be disposed transitioning between the bottom of the groove 14 and the side wall of the groove 14, and the second curved line 152 may be disposed transitioning between the side wall of the groove 14 and the non-recessed surface of the first inorganic encapsulation layer 131.

The transition between the bottom of the groove 14 and the side wall of the groove 14 may be smoothed through the first curved line 151. When being bent, the bending stress at the bottom and on the side wall of the groove 14 may be further reduced. Thus, the risk of cracks in the first inorganic encapsulation layer 131 may be further reduced, and the bending performance of the flexible display panel when being bent may be improved.

It should be noted that, FIG. 7A shows the first curved line 151 may be disposed transitioning between the bottom of the groove 14 and the side wall of the groove 14, and the second curved line 152 may be disposed transitioning between the side wall of the groove 14 and the non-recessed surface of the first inorganic encapsulation layer 131, which is for illustrative purposes and is not intended to limit the scope of the present disclosure.

In another embodiment, the flexible display panel may include at least one of the following: a bottom of the at least one groove transitions to a side wall of the at least one groove through a first curved line; and the side wall of the at least one groove transitions to a non-recessed surface of the at least one organic encapsulation layer through a second curved line. Thus, the risk of cracks in the inorganic encapsulation layer may be further reduced, and the bending performance of the flexible display panel when being bent may be improved.

In particular, referring to FIG. 7A, an angle $\alpha$ formed between the first curved line 151 and the bottom of the groove 14 may be determined according to various application scenarios. In one embodiment, the angle $\alpha$ formed between the first curved line 151 and the bottom of the groove 14 may be greater than about 0° and smaller than or equal to about 70°, i.e., $0° < \alpha \leq 70°$. In another embodiment, the angle $\alpha$ formed between the first curved line 151 and the bottom of the groove 14 may be greater than about 15° and smaller than or equal to about 70°, i.e., $15° < \alpha \leq 70°$.

When the angle $\alpha$ formed between the first curved line 151 and the bottom of the groove 14 is large, for example, greater than about 70° and smaller than or equal to about 90°, a substantially large bending stress may be generated when the flexible display panel is bent. The bending stress may likely concentrate at the corners of the groove 14, i.e., where the angle $\alpha$ between the first curved line 151 and the bottom of the groove 14 is formed or where the angle $\beta$ between the second curved line 152 and the non-recessed surface of the first inorganic encapsulation layer 131 is formed. When the corners of the groove 14 are steep slopes or sharp corners, cracks or even breaks may be likely to occur at the steep slopes or sharp corners.

When the angle $\alpha$ formed between the first curved line 151 and the bottom of the groove 14 is sustainably small, the bottom width of the groove 14 may be sustainably wide, and the groove 14 may extend into the display area of the flexible display panel, thereby causing the light emitted from the display area to refract and reflect and degrading the display performance of the flexible display panel. Thus, the angle $\alpha$ formed between the first curved line 151 and the bottom of the groove 14 may be configured to be approximately greater than about 15° and smaller than or equal to about 70°, i.e., $15° < \alpha \leq 70°$.

Similarly, an angle $\beta$ formed between the second curved line 152 and the non-recessed surface of the first inorganic encapsulation layer 131 may be determined according to various application scenarios. In one embodiment, the angle $\beta$ formed between the second curved line 152 and the non-recessed surface of the first inorganic encapsulation layer 131 may be greater than about 0° and smaller than or equal to about 60°, i.e., $0° < \beta \leq 60°$. In another embodiment, the angle $\beta$ formed between the second curved line 152 and the non-recessed surface of the first inorganic encapsulation layer 131 may be greater than about 15° and smaller than or equal to about 70°, i.e., $15° < \beta \leq 70°$.

When the angle $\beta$ formed between the second curved line 152 and the non-recessed surface of the first inorganic encapsulation layer 131 is large, for example, greater than about 70° and smaller than or equal to about 90°, a substantially large bending stress may be generated when the flexible display panel is bent. The bending stress may likely concentrate at the corners of the groove 14, thereby causing the groove 14 to crack or break.

When the angle $\beta$ formed between the second curved line 152 and the non-recessed surface of the first inorganic encapsulation layer 131 is substantially small, the bottom width of the groove 14 may be wide, and the groove 14 may extend into the display area of the flexible display panel, thereby causing the light emitted from the display area to refract and reflect, and degrading the display performance of the flexible display panel. Thus, the angle $\beta$ formed between the second curved line 152 and the non-recessed surface of the first inorganic encapsulation layer 131 may be configured to be greater than about 15° and smaller than or equal to about 45°, i.e., 15°<β≤45°.

Figure 7B:
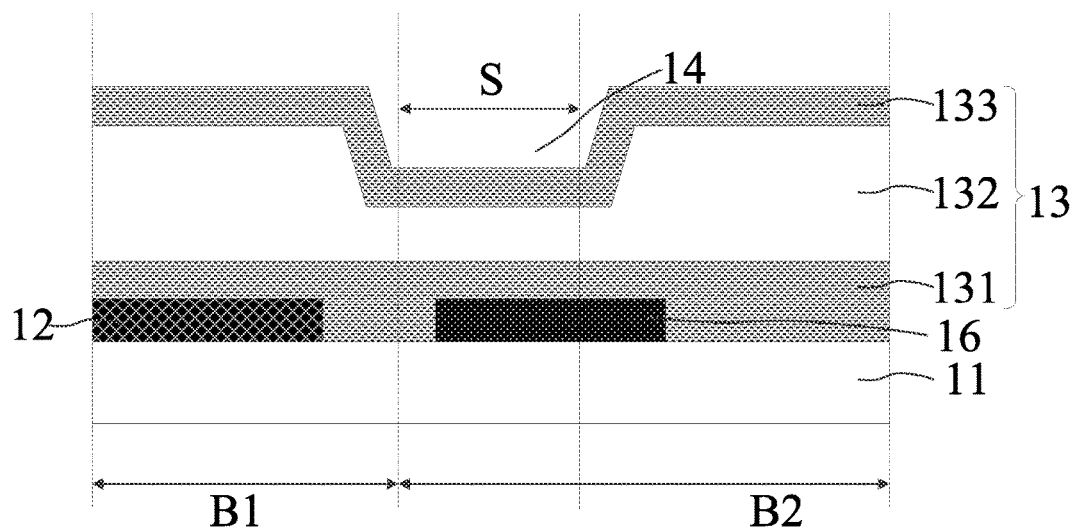
FIG. 7B illustrates a cross-sectional view of another exemplary flexible display panel according to disclosed embodiments.

FIG. 7B illustrates a cross-sectional view of another exemplary flexible display panel according to disclosed embodiments. The similarities between FIG. 7A and FIG. 7B are not repeated here, while certain differences may be explained.

As shown in FIG. 7B, the flexible display panel may include a display area B1 and a non-display area B2. The non-display area B2 of the flexible display panel may be configured with a peripheral circuit 16. The flexible display panel may include at least one bending area S. The second inorganic encapsulation layer 132 may have a first side facing the flexible substrate 11 and an opposing side, and at least groove 14 may be disposed on the opposing side of the second inorganic encapsulation layer 132 in the bending area S.

Further, an orthogonal projection of the peripheral circuit 16 onto the flexible substrate 11 may partially overlap with an orthogonal projection of the bending area S onto the flexible substrate 11. Thus, the bending area S may not separately occupy the non-display area B2 of the flexible display panel, thereby facilitating a narrow frame design of the flexible display panel.

In various practical applications, after the bending area S is bent, the non-display area B2 may become a side wall of the flexible display panel. When the flexible display panel is incorporated in a display apparatus, the bending area S may be bent, such that the non-display area B2 may become a side wall of the display apparatus, or the non-display area B2 may be folded to the back wall of the display area B1. Thus, a borderless design of the display apparatus may be achieved, and non-display area B2 may be called an edge area or border area.

FIGS. 7A-7B illustrates that the thin-film-encapsulation layer 13 may include two inorganic encapsulation layers and one organic encapsulation layer, and at least groove 14 may be disposed on the opposing side of the first inorganic encapsulation layer 131 in the bending area S, which is for illustrative purposes and is not intended to limit the scope of the present disclosure. In another embodiment, the number of the inorganic encapsulation layers and the number of the organic encapsulation layers each may be configured to be larger than 1, and more than one inorganic encapsulation layer may be configured with the groove. Exemplary structures are shown in FIGS. 7C-7G.

Figure 7C:
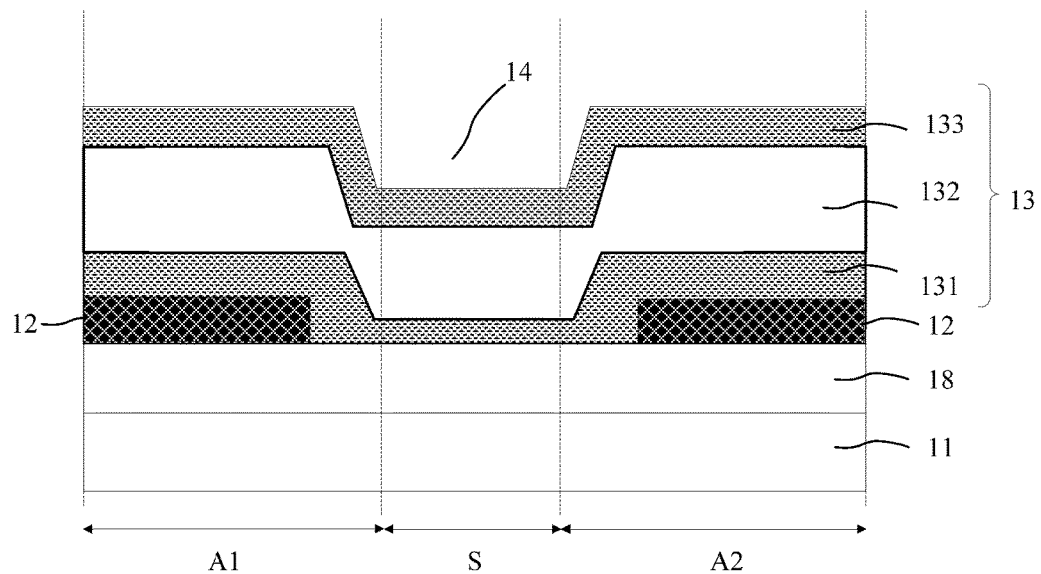
FIG. 7C illustrates a cross-sectional view of another exemplary flexible display panel according to disclosed embodiments.

FIG. 7C illustrates a cross-sectional view of another exemplary flexible display panel according to disclosed embodiments. The similarities between FIG. 7A and FIG. 7C are not repeated here, while certain differences may be explained.

As shown in FIG. 7C, the thin-film-encapsulation layer 13 may include a first inorganic encapsulation layer 131, a first organic encapsulation layer 132, a second inorganic encapsulation layer 133. The first inorganic encapsulation layer 131 may be disposed between the organic light-emitting layer 12 and the first organic encapsulation layer 132, and the first organic encapsulation layer 132 may be disposed between the first inorganic encapsulation layer 131 and the second inorganic encapsulation layer 133.

At least one of the first inorganic encapsulation layer 131 and the second inorganic encapsulation layer 133 may be configured with at least one groove 14 in the bending area S. In one embodiment, as shown in FIG. 7C, the first inorganic encapsulation layer 131 and the second inorganic encapsulation layer 133 each may have a first side facing the flexible substrate 11 and an opposing side. In the bending area S, at least one groove 14 may be disposed on the opposing side of the first inorganic encapsulation layer 131 and the opposing side of the second inorganic encapsulation layer 133.

Due the material properties of the inorganic encapsulation layer, cracks easily occur during bending. Through configuring at least one groove 14 on the opposing side of at least one of the first inorganic encapsulation layer 131 and the second inorganic encapsulation layer 133 in the bending area S, the stress generated during bending may be reduced. Thus, cracks or even breaks in the first inorganic encapsulation layer 131 and/or the second inorganic encapsulation layer 133, which is generated due to the substantially large stress in the first inorganic encapsulation layer 131 or the second inorganic encapsulation layer 133, may be suppressed.

It should be noted that, in addition to configuring both the first inorganic encapsulation layer 131 and the second inorganic encapsulation layer 133 to be provided with at least one groove 14 in the bending area S, the first organic encapsulation layer 132 disposed between the first inorganic encapsulation layer 131 and the second inorganic encapsulation layer 133 may also be configured with at least one groove 14 in the benign area S. Thus, in the bending area S, the second inorganic encapsulation layer 133 may get closer to the neutral plane and, accordingly, the bending stress of the second inorganic encapsulant layer 133 may be further reduced, the risk of bending cracks and breaks may be reduced, and the encapsulation effect may be further ensured.

Figure 7D:
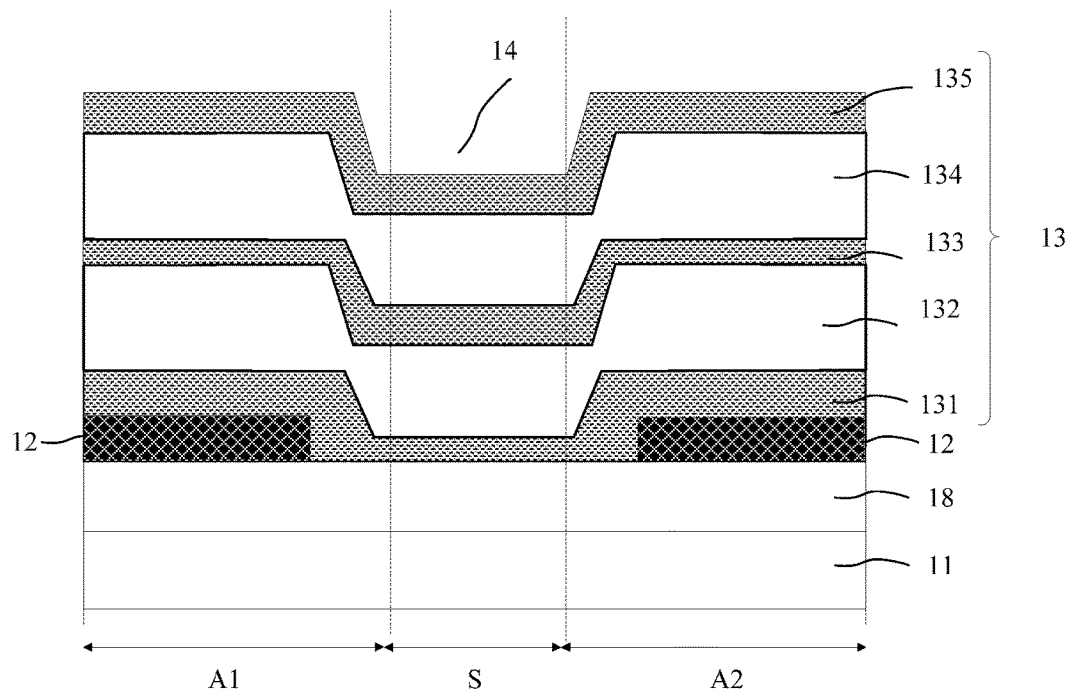
FIG. 7D illustrates a cross-sectional view of another exemplary flexible display panel according to disclosed embodiments.

FIG. 7D illustrates a cross-sectional view of another exemplary flexible display panel according to disclosed embodiments. The similarities between FIG. 7D and FIG. 7C are not repeated here, while certain differences may be explained.

As shown in FIG. 7D, the thin-film-encapsulation layer 13 may include a first inorganic encapsulation layer 131, a first organic encapsulation layer 132, a second inorganic encapsulation layer 133, a second organic encapsulation layer 134, and a third inorganic encapsulation layer 135, which may be sequentially on the opposing side of the organic light-emitting layer. At least one of the first inorganic encapsulation layer 131, the second inorganic encapsulation layer 133 and the third inorganic encapsulation layer 135 may be configured with at least one groove 14 in the bending area S, such that the bending stress may be reduced. Accordingly, the first inorganic encapsulation layer 131, the second inorganic encapsulation layer 133 and the third inorganic encapsulation layer 135 may be prevented from cracking or breaking caused by an excessive bending stress when being bent.

In the bending area S, through configuring at least one groove 14 on the opposing side of the inorganic encapsulation layer, the thickness of the inorganic encapsulation layer may be reduced. In addition, the inorganic encapsulation layer may also be disposed with at least one groove 14 in the bending area S. Thus, in the bending area, the inorganic encapsulation layer may get closer to the neutral plane and, accordingly, the bending stress of the inorganic encapsulant layer may be further reduced, the risk of bending cracks and breaks may be reduced, and the encapsulation effect may be further ensured.

Further, employing three inorganic encapsulation layers and two organic encapsulation layers may ensure the encapsulation effectiveness of the thin-film-encapsulation layer 13, and improve the life span of the flexible display panel.

In certain embodiments, the disclosed flexible display panel may reduce the bending stress by reducing the thickness of certain sub-layers of the thin-film-encapsulation layer, instead of completely removing certain sub-layers of the thin-film-encapsulation layer in the existing flexible display panel. Thus, the bending stress in the bending area may still be effectively reduced and, meanwhile, ambient moisture and oxygen may be effectively prevented from entering the organic light-emitting layer through the thin-film-encapsulation layer, thereby ensuring the encapsulation of the thin-film-encapsulation layer. A corresponding structure is shown in FIG. 7E.

Figure 7E:
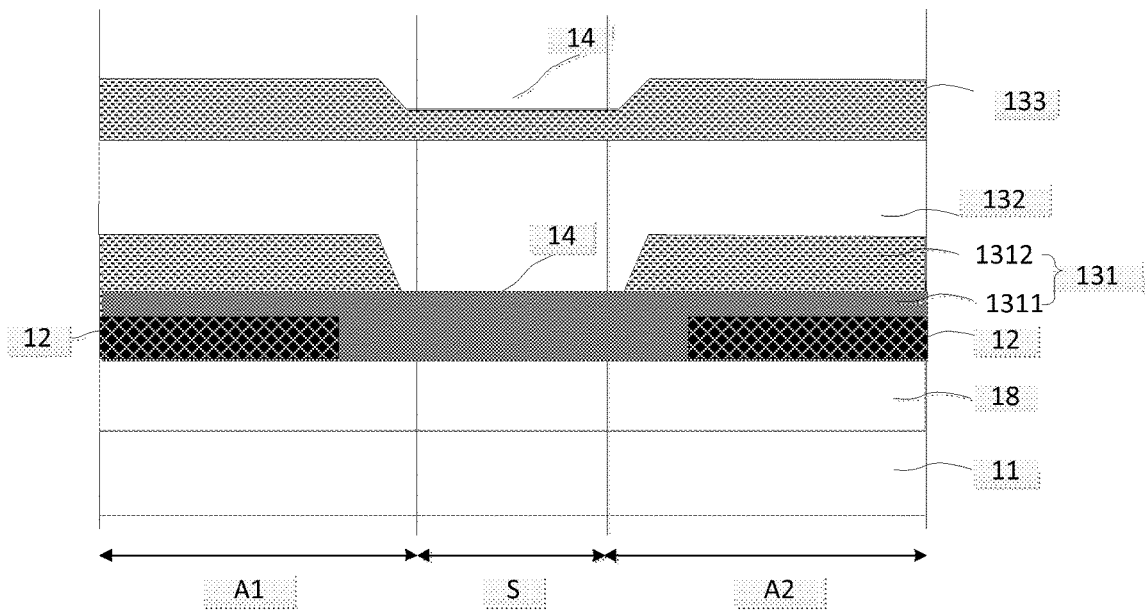
FIG. 7E illustrates a cross-sectional view of another exemplary flexible display panel according to disclosed embodiments.

FIG. 7E illustrates a cross-sectional view of another exemplary flexible display panel according to disclosed embodiments. The similarities between FIG. 7E and FIG. 7C are not repeated here, while certain differences may be explained.

As shown in FIG. 7E, the thin-film-encapsulation layer 13 may include a first inorganic encapsulation layer 131, a first organic encapsulation layer 132, a second inorganic encapsulation layer 133. The first inorganic encapsulation layer 131 may further include a first inorganic encapsulation sub-layer 1311 and a second inorganic encapsulation sub-layer 1312. The first inorganic encapsulation sub-layer 1311 may be continuously disposed to cover the entire flexible display panel.

The second inorganic encapsulation sub-layer 1312 may be discontinued in the bending area S or may be continued but have a reduced thickness in the bending area S as compared the area outside the bending area S (i.e., a non-bending area), thereby forming at least one groove 14. In one embodiment, as shown in FIG. 7E, the second inorganic encapsulation sub-layer 1312 may be discontinued in the bending area S.

In one embodiment, the first inorganic encapsulation sub-layer 1311 may be fabricated by an atomic layer deposition (ALD) process, and both the second inorganic encapsulation sub-layer 1312 and the second inorganic encapsulation layer 133 may be fabricated by chemical vapor deposition (CVD) process. The second inorganic encapsulation sub-layer 1312 may be discontinued in the bending area S or may be continued but have a reduced thickness in the bending area S as compared the area outside the bending area S (i.e., a non-bending area), thereby forming at least one groove 14.

After the organic light-emitting layer 12 is prepared, particles or dust may remain on the surface. Through fabricating the first inorganic encapsulation sub-layer 1311 by an atomic layer deposition (ALD) process, particles or dust may be well covered. Meanwhile, and the films fabricated by the ALD process may be substantially rigid with desired moisture and oxygen barrier properties. In addition, the film thickness of the first inorganic encapsulation sub-layer 1311 prepared by the ALD process may be substantially thin, such that the first inorganic encapsulation sub-layer 1311 may have substantially good bending performance even without disposing with the groove.

After the second inorganic encapsulation sub-layer 1312 is disposed on the first inorganic encapsulation sub-layer 1311, the encapsulation effect may be further improved. Furthermore, through disposing at least one groove 14 on the second inorganic encapsulation sub-layer 1312 in the bending area, the bending stress generated at the second inorganic encapsulation sub-layer 1312 may be reduced, and the bending performance may be improved.

In another embodiment, the first inorganic encapsulation sub-layer 1311 may be continued but have a reduced thickness in the bending area S as compared the area outside the bending area S (i.e., a non-bending area), thereby forming at least one groove 14. The first inorganic encapsulation sub-layer 1311 may be fabricated by the chemical vapor deposition (CVD) process. Because the first inorganic encapsulation sub-layer 1311 fabricated by the chemical vapor deposition (CVD) process is substantially thick, a portion of the first inorganic encapsulation sub-layer 1311 may be removed in the bending area to form the groove 14, for example, the thickness of the first inorganic encapsulation sub-layer 1311 may be reduced in the bending area to form the groove 14.

Then the second inorganic encapsulation sub-layer 1312 may be fabricated by the atomic layer deposition (ALD) process. The films fabricated by the ALD process may be substantially rigid with desired moisture and oxygen barrier properties. In addition, the film thickness of the first second inorganic encapsulation sub-layer 1312 prepared by the ALD process may be substantially thin, such that the second inorganic encapsulation sub-layer 1312 may have substantially good bending performance even without disposing with the groove.

Figure 7F:
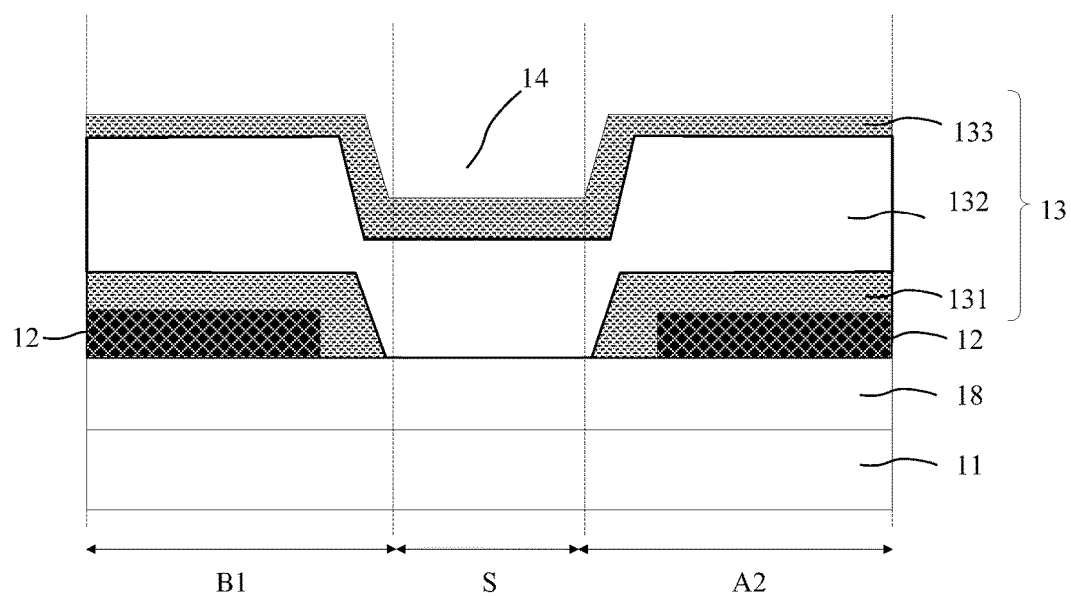
FIG. 7F illustrates a cross-sectional view of another exemplary flexible display panel according to disclosed embodiments.

FIG. 7F illustrates a cross-sectional view of another exemplary flexible display panel according to disclosed embodiments. The similarities between FIG. 7C and FIG. 7E are not repeated here, while certain differences may be explained.

As shown in FIG. 7F, the thin-film-encapsulation layer 13 may include a first inorganic encapsulation layer 131, a first organic encapsulation layer 132, a second inorganic encapsulation layer 133. Either the first inorganic encapsulation layer 131 or the second inorganic encapsulation layer 133 may be configured with at least one groove 14 in the bending area S, such that the bending stress may be reduced. In particular, in a direction perpendicular to the flexible substrate 11, the groove 14 disposed in the first inorganic encapsulation layer 131 may penetrate the entire first inorganic encapsulation layer 131. That is, the groove 14 disposed in the first inorganic encapsulation layer 131 may have a same thickness as the non-recessed region of the first inorganic encapsulation layer 131.

Figure 7G:
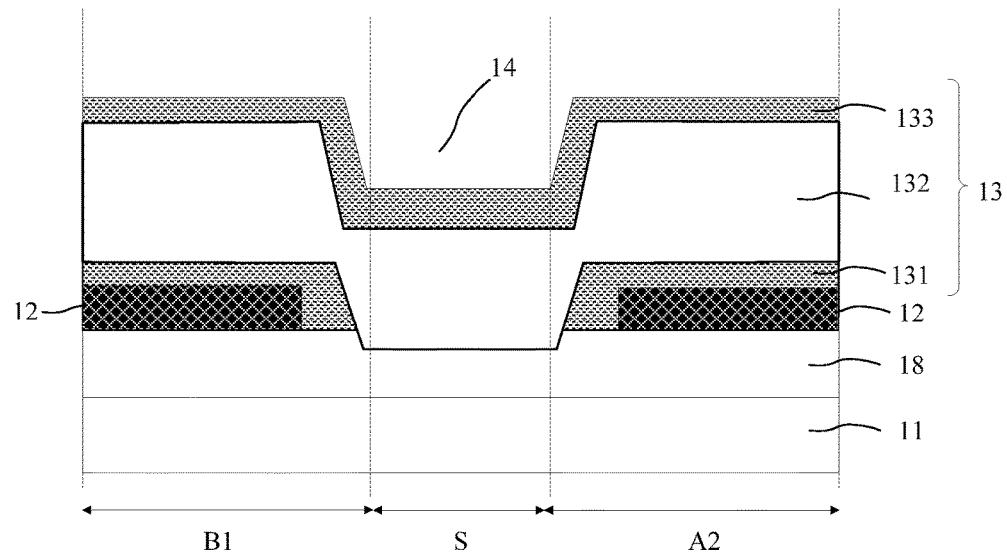
FIG. 7G illustrates a cross-sectional view of another exemplary flexible display panel according to disclosed embodiments.

FIG. 7G illustrates a cross-sectional view of another exemplary flexible display panel according to disclosed embodiments. The similarities between FIG. 7G and FIG. 7F are not repeated here, while certain differences may be explained.

As shown in FIG. 7G, the first inorganic encapsulation layer 131 and the second inorganic encapsulation layer 133 each may be configured with at least one groove 14 in the bending area S, such that the bending stress may be reduced. In particular, in a direction perpendicular to the flexible substrate 11, the groove 14 disposed in the first inorganic encapsulation layer 131 may penetrate the entire first inorganic encapsulation layer 131, and further extend into a planarization layer disposed between the organic light-emitting layer 12 and the thin-film-transistor layer 18. In another embodiment, the groove 14 disposed in the first inorganic encapsulation layer 131 may even extend into the thin-film-transistor layer 18, as long as the groove 14 is not in direct contact with the wiring region in the thin-film-transistor layer 18. Thus, when the flexible display panel is being bent, the encapsulation of the thin-film-encapsulation layer 13 may be further ensured, while the various wires in the wiring region may not be affected.

It should be noted that, the groove 14 may extend from the inorganic encapsulation layer to any appropriate layers in the flexible display panel, as long as the normal light-emitting function of the organic light-emitting layer is not affected, signals are normally provided to the organic light-emitting devices, the organic light-emitting devices are encapsulated by the inorganic encapsulation layer without affected by the outside moisture and oxygen, and the encapsulation effect is well ensured. Exemplary structures will be explained in FIG. 8A and FIG. 8D.

In the disclosed embodiments, the number of the inorganic encapsulation layers which are disposed with at least one groove 14 in the bending area S, as well as, the number of the organic encapsulation layers, is for illustrative purposes and is not intended to limit the scope of the present disclosure. In practical applications, the thin-film-encapsulation layer 13 may include a plurality of inorganic encapsulation layers and a plurality of organic encapsulation layers alternately arranged in a direction perpendicular to the flexible substrate 11. The number of the inorganic encapsulation layers, which are disposed with at least one groove 14 in the bending area S, may be determined according to various applications.

In certain embodiments, as shown in FIGS. 7A-7F, the flexible display panel may include at least one groove 14 disposed on at least one inorganic encapsulation layer of the thin-film-encapsulation layer 13 at the bending area S. In certain other embodiments, in the bending area S, at least one groove 14 may be disposed on a photo spacer disposed between the organic light-emitting layer 12 and the thin-film-encapsulation layer 13, the organic light-emitting layer 12, a polarization layer disposed between the organic light-emitting layer 12 and the thin-film-transistor layer 18, or the thin-film-transistor layer 18.

Figure 8A:
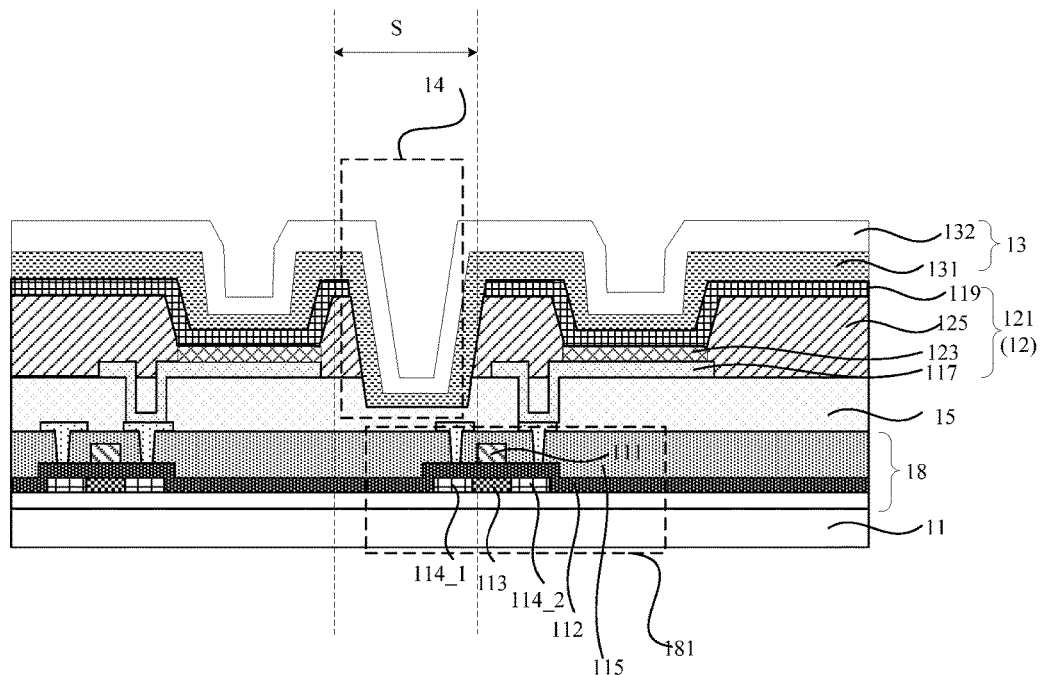
FIG. 8A illustrates a cross-sectional view of another exemplary flexible display panel according to disclosed embodiments.

FIG. 8A illustrates a cross-sectional view of another exemplary flexible display panel according to disclosed embodiments.

As shown in FIG. 8A, the flexible display panel may include a flexible substrate 11, a thin-film-transistor layer 18, a planarization layer 15, an organic light-emitting layer 12, and a thin-film-encapsulation layer 13. The thin-film-transistor layer 18 may be disposed between the organic light-emitting layer 12 and the flexible substrate 11. The planarization layer 15 may be disposed between the organic light-emitting layer 12 and thin-film-transistor layer 18. The thin-film-transistor layer 18 may include a plurality of thin-film-transistors (TFT) 181, storage capacitors, data lines, gate lines, power supply voltage lines, and ground lines, etc. The organic light-emitting layer 12 may include a plurality of organic light-emitting components 121. The TFT may drive a corresponding organic light-emitting component 121 to emit light, thereby displaying images. FIG. 8A merely shows two TFTs 181 and two organic light-emitting components 121 for illustrative purposes.

The organic light-emitting component 121 may include a first electrode 117 (e.g., a nontransparent anode or reflective anode), a pixel defining layer 125, an organic light-emitting material layer 123 and a second electrode 119 (e.g., a cathode). The organic light-emitting material layer 123 may be disposed between the first electrode 117 and the second electrode 119. The pixel defining layer 125 be disposed on the planarization layer 15 and may have an opening exposing the first electrode 117. The organic light-emitting material layer 123 may be formed in a pixel defined by the pixel defining layer 125 and correspond to the opening. Each pixel may include one organic light-emitting component 121 capable of emitting light in one color, and each organic light-emitting component 121 may form a light-emitting pixel 17 in FIGS. 8B and 8C.

The organic light-emitting material layer 123 may include at least an emission layer and may include at least one of a hole injection layer, a hole transport layer, an electron transport layer, and an electron injection layer. The pixel defining layer 125 may be an organic layer or an inorganic layer. In one embodiment, the pixel defining layer 125 may be an organic layer. For example, the material of the pixel defining layer 125 may include at least one of benzocyclobutene (BCB), acryl polymer, and polyimide.

The planarization layer 15, which is disposed between the organic light-emitting layer 12 and thin-film-transistor layer 18, may be an organic layer, an inorganic layer, or a combination thereof. For example, the inorganic layer may be formed of spin on glass (SOG), and the material of the organic layer may include at least one of benzocyclobutene (BCB), acryl polymer, and polyimide.

The TFT 181 driving the organic light-emitting device may include a gate electrode 111, a source electrode 114_1 and a drain electrode 114_2 (i.e., source-drain electrode), a semiconductor active layer 113, and at least one insulating layer. In one embodiment, as shown in FIG. 8A, the TFT 181 may be a top-gate TFT. The source electrode 114_1, the drain electrode 114_2, and the semiconductor active layer 113 may be disposed on the flexible substrate 11, a gate electrode insulating layer 112 may be disposed on the semiconductor active layer 113 and the source electrode 114_1 and the drain electrode 114_2, and the gate electrode 111 may be disposed on a side of the gate electrode insulating layer 112 away from the flexible substrate 11.

In addition, a passivation layer 115 may be disposed on the gate electrode insulating layer 112 and the gate electrode 111. The first electrode 117 of the corresponding organic light-emitting component 121 may be electrically connected to the drain electrode 114_2 of the TFT 181 through a through hole penetrating the passivation layer 115. The gate electrode insulating layer 112 may include one or more of a silicon oxide film, a silicon nitride film, a silicon nitride oxide film, an aluminum oxide film or a titanium oxide film. In the disclosed embodiments, in addition to silicon oxide film, silicon nitride film, silicon nitride oxide film, aluminum oxide film or titanium oxide film, the gate electrode insulating layer 112 may also be films formed by other inorganic insulating materials which have a same or similar property as the above-mentioned films. The passivation layer 115 may include any one of silicon oxide and silicon nitride, or may be a composite layer including both silicon oxide and silicon nitride.

Further, the flexible display panel may include a plurality of photo spacers (PS) (not shown in FIG. 8A) disposed on the pixel defining layer 125, and disposed between the organic light-emitting layer 12 and the thin-film-encapsulation layer.

The flexible display panel may include at least one bending area S, and in the benign area, at least one groove is formed on a photo spacer, the pixel defining layer 125 of the organic light-emitting layer 12, the at least one insulating layer of the thin-film-transistor layer 18, or the planarization layer 15. The bottom width W of the groove 14 may be configured to be $$W \geq \frac{n}{180°}\pi R,$$

where n is a maximum bending angle of the bending area, $0° < n \leq 180°$, and R is a bending radius of the bending area.

Thus, the thickness of the flexible display panel may be reduced at the bending area S, and the bending stress generated in the bending area S of the flexible display panel may be reduced. Accordingly, the flexible display panel may be prevented from cracking or breaking caused by an excessive bending stress when being bent, and the encapsulation effectiveness of the thin-film-encapsulation layer 13 may be ensured.

In one embodiment, bottom width W of the groove 14 may be configured to be W≥πR. Thus, corners of the groove 14 may be arranged outside the bending area S, and the stress may be prevented from being concentrated at the corners of the groove 14. Accordingly, cracks and breaks may be suppressed at the corners of the groove 14.

In one embodiment, as shown in FIG. 8A, the flexible display panel may include at least one bending area S. The pixel defining layer 125 and the planarization layer 15 each may have a first side facing the flexible substrate 11 and an opposing side far away from the flexible substrate 11. In the bending area, at least groove 14 may be disposed on the opposing side of the planarization layer 15 and the opposing side of the pixel defining layer 125. In addition, the groove 14 may be disposed between two adjacent pixels. That is, the orthogonal projection of the groove 14 onto the flexible substrate 11 may not overlap with the orthogonal projection of any pixel onto the flexible substrate 11.

Figure 8B:
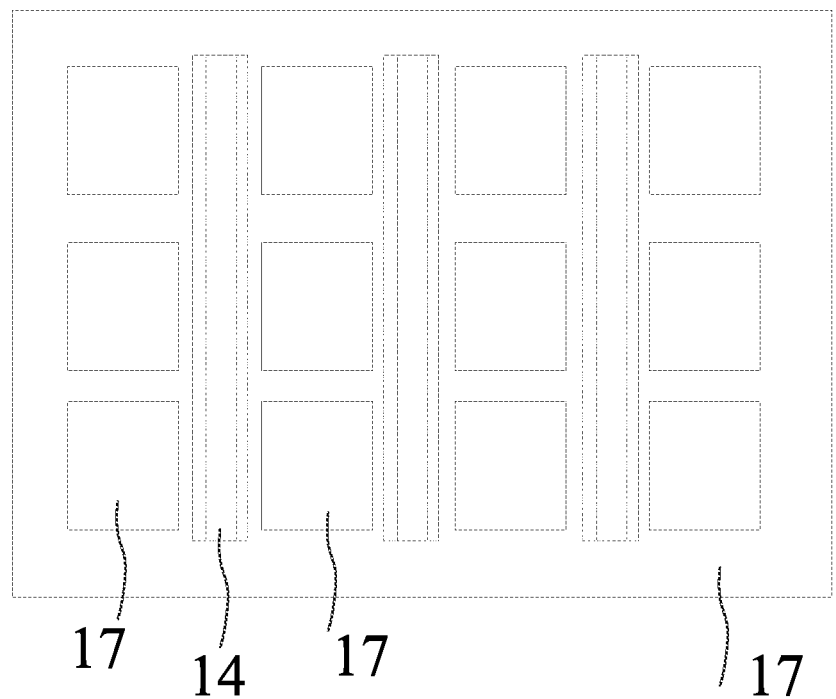
FIG. 8B illustrates a top view of another exemplary flexible display panel according to disclosed embodiments.
Figure 8C:
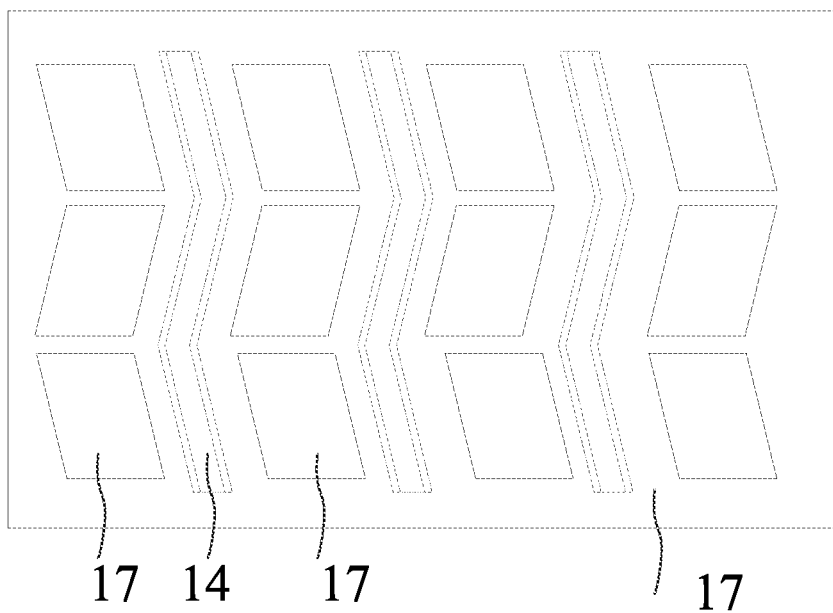
FIG. 8C illustrates a top view of another exemplary flexible display panel according to disclosed embodiments.

In one embodiment, as shown in FIG. 8B, a plurality of grooves 14 may be configured on the planarization layer 15. Each groove 14 may be disposed between any two adjacent columns of pixels 17. Each pixel 17 may include the organic light-emitting layer 12 capable of emitting light in one color. The groove 14 may be arranged in a straight line in an extension direction of the groove 14. That is, the groove 14 may have a straight-line shape. In another embodiment, as shown in FIG. 8C, a plurality of grooves 14 may be configured on the pixel defining layer 125. Each groove 14 may be disposed between any two adjacent columns of pixels 17. The groove 14 may be arranged in a folded line in an extension direction of the groove 14. That is, the groove 14 may have a folded line shape.

It should be noted that, the shape of the groove 14 shown in FIGS. 8B-8C are for illustrative purposes and are not intended to limit the scope of the present disclosure. As long as the groove 14 is disposed between two adjacent columns/rows of pixels 17, the groove 14 may have any appropriate line shape. In practical applications, the grooves 14 may be arranged in a way adapting to the shape and arrangement of the pixels.

Through configuring at least one of the pixel defining layer 125 and the planarization layer 15 with at least one groove 14 formed in the bending area S, the thickness of the flexible display panel at the bending area S may be reduced, the bending stress may be reduced, and the bending reliability of the flexible display panel may be enhanced. Because the groove 14 is disposed between two adjacent pixels 17, the normal display of the pixel 17 may not be affected.

Figure 8D:
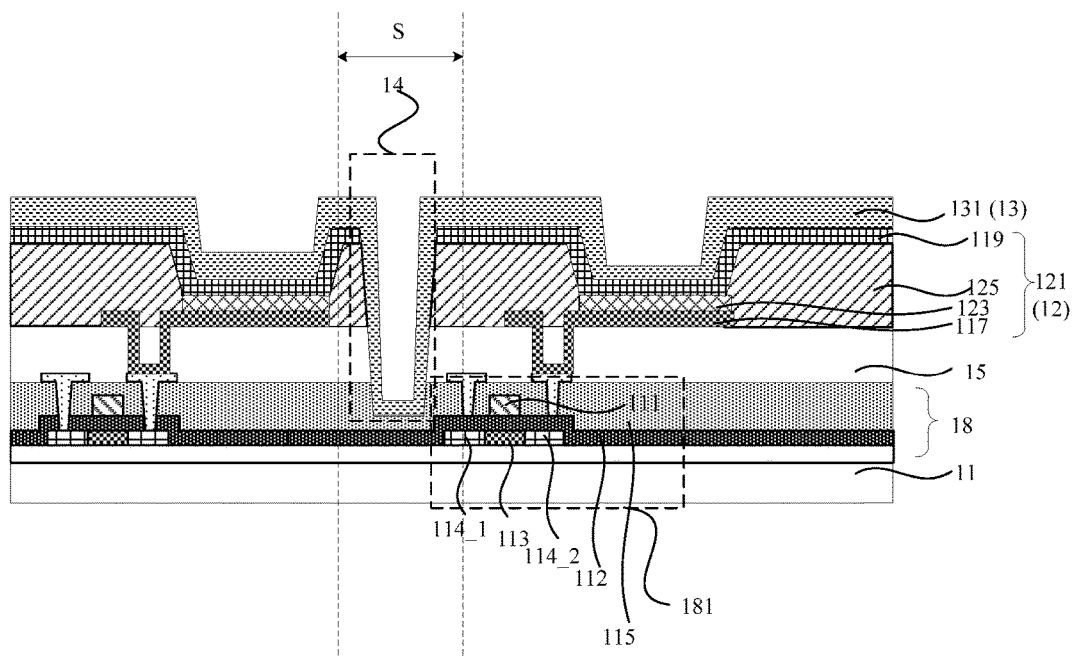
FIG. 8D illustrates a cross-sectional view of another exemplary flexible display panel according to disclosed embodiments.

FIG. 8D illustrates a cross-sectional view of another exemplary flexible display panel according to disclosed embodiments. The similarities between FIG. 8A and FIG. 8D are not repeated here, while certain differences may be explained.

As shown in FIG. 8D, the flexible display panel may include at least one bending area S. In the bending area, at least groove 14 may be disposed on the at least one insulating layer of the thin-film-transistor layer 18.

In one embodiment, as shown in FIG. 8, the passivation layer 115 in the TFT 181 may have a first side facing the flexible substrate 11 and an opposing side far away from the flexible substrate 11, and at least one groove 14 may be disposed on the opposing side of the passivation layer 115 in the bending area S, and the groove 14 may not be in direct contact with the wiring region in the thin-film-transistor layer 18.

Thus, the thickness of the flexible display panel may be reduced at the bending area S, and the bending stress generated in the bending area S of the flexible display panel may be reduced. Accordingly, the flexible display panel may be prevented from cracking or breaking caused by an excessive bending stress when being bent. In addition, the first inorganic encapsulation layer 131 and the passivation layer 15 are in direct contact with each other, and both the first inorganic encapsulation layer 131 and the passivation layer 15 are inorganic layers. Thus, the first inorganic encapsulation layer 131 and the passivation layer 15 may have an improved interfacial contact. Accordingly, the peeling or the separation between the first inorganic encapsulation layer 131 and the passivation layer 15 when the flexible display panel is being bent may be suppressed, the moisture and oxygen may be prevented from entering the organic light-emitting components at the separation, and the encapsulation effectiveness of the thin-film-encapsulation layer 13 may be ensured. Meanwhile, because the groove 14 is not in direct contact with the wiring region in the thin-film-transistor layer 18, the various wires in the wiring region may not be affected by the groove 14.

Figure 8E:
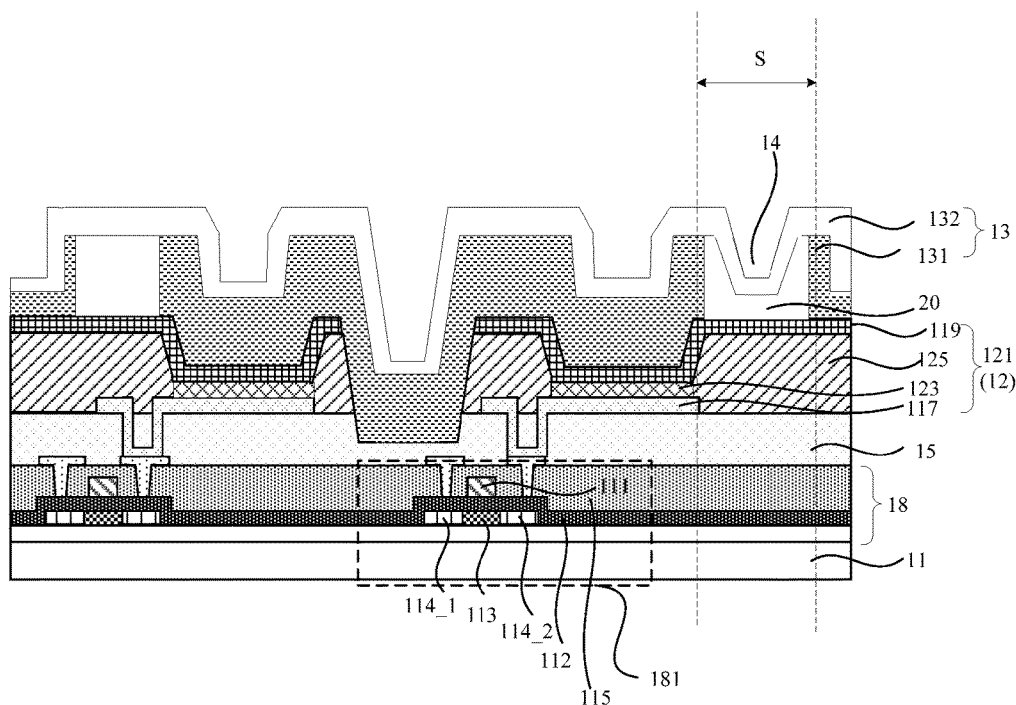
FIG. 8E illustrates a top view of another exemplary flexible display panel according to disclosed embodiments.

FIG. 8E illustrates a cross-sectional view of another exemplary flexible display panel according to disclosed embodiments. The similarities between FIG. 8A and FIG. 8E are not repeated here, while certain differences may be explained.

As shown in FIG. 8E, the flexible display panel may include a plurality of photo spacers (PS) 20 disposed on the pixel defining layer 125 and, more particularly, the spacers (PS) 20 may be disposed between the pixel defining layer 125 and thin-film-encapsulation layer 13. The spacers 20 may be made of, for example, benzocyclobutene (BCB), acryl polymer, or polyimide. The spacers 20 may serve as points of contact with a deposition mask for depositing the organic light-emitting material. The spacers 20 may prevent direct contact of constituent elements formed on the flexible substrate (other than the spacers themselves) with the deposition mask, and facilitate the depositing of the organic light-emitting material through the deposition mask to form the organic light-emitting material layer. The thin-film-encapsulation layer 13 may be bonded to the flexible substrate 11 to complete the flexible display panel.

The flexible display panel may include at least one bending area S, and in the bending area S, at least one spacer 20 may be disposed with at least one groove 14. In particular, the spacer 20 may have a first side facing the flexible substrate 11 and an opposing side far away from the flexible substrate 11, and at least one groove 14 may be disposed on the opposing side of the spacer 20 in the bending area S.

Thus, the thickness of the flexible display panel may be reduced at the bending area S, and the bending stress generated in the bending area S of the flexible display panel may be reduced. Accordingly, the flexible display panel may be prevented from cracking or breaking caused by an excessive bending stress when being bent, and the encapsulation effectiveness of the thin-film-encapsulation layer 13 may be ensured.

In addition, the thickness of the groove 14 may be smaller than or equal to the thickness of the spacer 20. Even the thickness of the groove 14 is equal to the thickness of the spacer 20, the support between the thin-film-encapsulation layer 13 and the flexible substrate 11 may not be degraded because a plurality of spacers 20 are disposed on the pixel defining layer 125.

In certain embodiments, the groove 14 may penetrate the entire spacer 20 into the pixel defining layer 125 in the organic-light emitting layer 12. In certain other embodiments, the groove 14 may further extend into the planarization layer 15 arranged between the organic-light emitting layer 12 and the thin-film-transistor layer 18. In certain other embodiments, the groove 14 may further extend into passivation layer 115 and/or the gate electrode insulating layer 112 in the thin-film-transistor layer 18, as long as the groove 14 is not in contact with the wiring region in the thin-film-transistor layer 18.

The present disclosure further provides a flexible display panel where at least one groove may be formed in the flexible substrate.

Figure 9A:
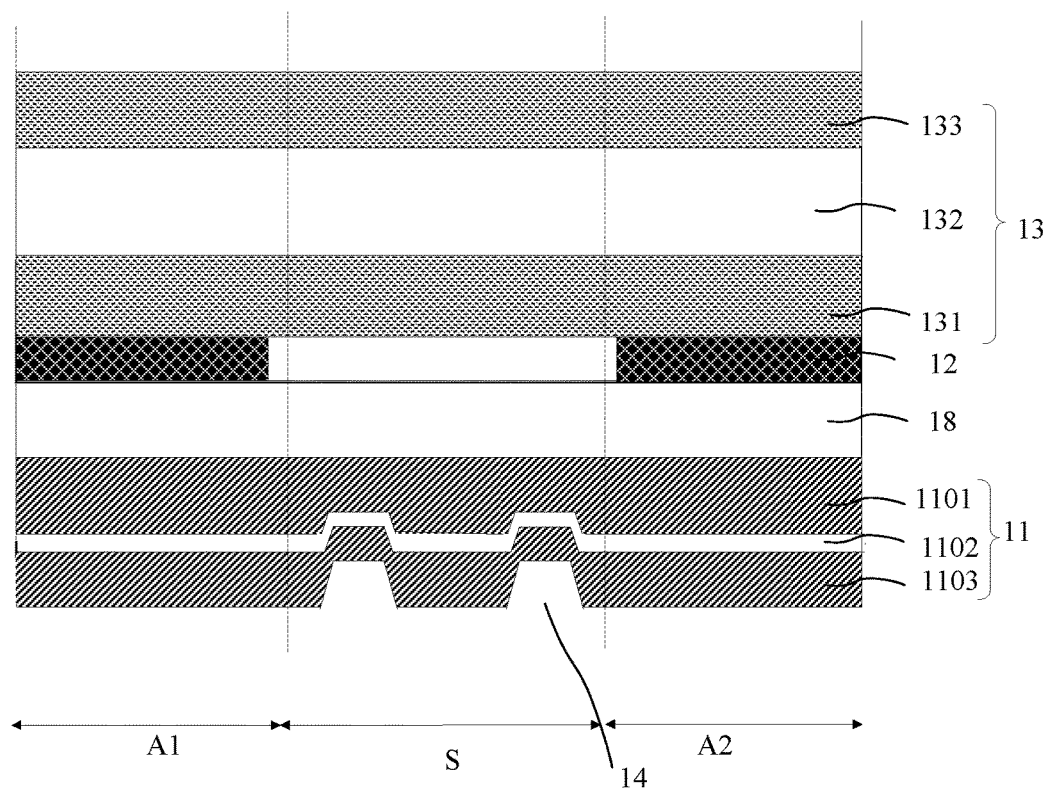
FIG. 9A illustrates a cross-sectional view of another exemplary flexible display panel according to disclosed embodiments.

FIG. 9A illustrates a cross-sectional view of another exemplary flexible display panel according to disclosed embodiments. As shown in FIG. 9A, the flexible display panel may include a flexible substrate 11, a thin-film-transistor layer 18, an organic light-emitting layer 12, and a thin-film-encapsulation layer 13. The thin-film-transistor layer 18 may be disposed between the flexible substrate 11 and the organic light-emitting layer 12. The organic light-emitting layer 12 may have a first side facing the flexible substrate 1 and an opposing side. The thin-film-encapsulation layer 13 may be disposed on the opposing side of the organic light-emitting layer 12. The thin-film-encapsulation layer 13 may include at least one organic encapsulation layer and at least one inorganic encapsulation layer. In one embodiment, as shown in FIG. 9A, the thin-film-encapsulation layer 13 may include a first inorganic encapsulation layer 131, a second inorganic encapsulation layer 133, and a first organic encapsulation layer 132, which are sequentially disposed on the opposing side of the organic light-emitting layer 12.

The flexible substrate 11 may include a base substrate 1101, an adhesive layer 1102, and a lower protective layer 1103. The base substrate 1101 may be made of any appropriate transparent materials with a desired flexibility. The adhesive layer 1102 may be made of any appropriate adhesive, such as liquid optically clear adhesive (LOCA), UV curable adhesive. The lower protective film 1103 may be attached to the base substrate 1101 through the adhesive layer 1102, thereby protecting the flexible display panel from the lower side.

In one embodiment, the base substrate 1101 may be made of polyimide (PI). Because the PI often has a desired heat resistance, when the TFTs are fabricated on the base substrate 1101 in the subsequent process, the base substrate 1101 may be able to stand the high temperature required for fabricating the TFTs. The adhesive layer 1102 may include a liquid optically clear adhesive (LOCA). Liquid optically clear adhesive (LOCA) is often adopted to attach a cover lens or cover glass to a display panel in OLEDs and LTPS-LCD (low temperature poly-silicon-LCD). LOCA has various advantages, such as high optical transmittance, good yellow resistance, low cost, good uniformity, and high yield.

The flexible display panel may include at least one bending area S. In the flexible substrate 11, at least one of the base substrate 1101, the adhesive layer 1102, and the lower protective layer 1103 may be configured with at least one groove 14 in the bending area S. The bottom width W of the groove 14 may be configured to be $$W \geq \frac{n}{180°}\pi R,$$

where n is a maximum bending angle of the bending area, 0°<n≤180°, and R is a bending radius of the bending area.

In one embodiment, as shown in FIG. 9A, the base substrate 1101 may be a single polyimide layer. The base substrate 1101 may have a first side facing the organic light-emitting layer 12 and an opposing side. At least one groove 14 may be disposed on the opposing side of the base substrate 1101 in the bending area S. The bottom width W of the groove 14 may be configured to be $$W \geq \frac{n}{180°}\pi R,$$

where n is a maximum bending angle of the bending area, 0°<n≤180°, and R is a bending radius of the bending area.

Thus, the thickness of the flexible display panel may be reduced at the bending area S, and the bending stress generated in the bending area S of the flexible display panel may be reduced. Accordingly, the flexible display panel may be prevented from cracking or breaking caused by an excessive bending stress when being bent, and the encapsulation effectiveness of the thin-film-encapsulation layer 13 may be ensured.

In one embodiment, bottom width W of the groove 14 may be configured to be W≥πR. Thus, the base substrate 1101 may have a reduced thickness in the bending area S, and the climbing position of the groove may be located just outside the bending area S, the bending stress in the bending area S may not concentrate at the climbing position.

In addition, the flexible display panel may also include a display area. The display area may include a first display area A1 and a second display area A2. Both the first display area A1 and the second display area A2 may be located adjacent to the bending area S. The bending area S may be disposed between the first display area A1 and the second display area A2. That is, the bending area S may also be located in the display area, but located in a non-light-emitting area of the display area. In particular, an orthogonal projection of the groove 14 on the organic light-emitting layer 12 may be located between two adjacent rows or two adjacent columns of sub-pixels.

In one embodiment, the first display area A1 and the second display area A2 may display different images. The bending area S may be disposed between the first display area A1 and the second display area A2. That is, the bending area S may bend downwards from an edge of the first display area A1. The bending area S may be a non-display area. The second display area A2 may be an area extended outward from the bending area S. In another embodiment, the bending area S may be located in the non-light-emitting area of the display area. In particular, an orthogonal projection of the groove 14 on the organic light-emitting layer 12 may be located between two adjacent rows or two adjacent columns of sub-pixels.

Figure 9B:
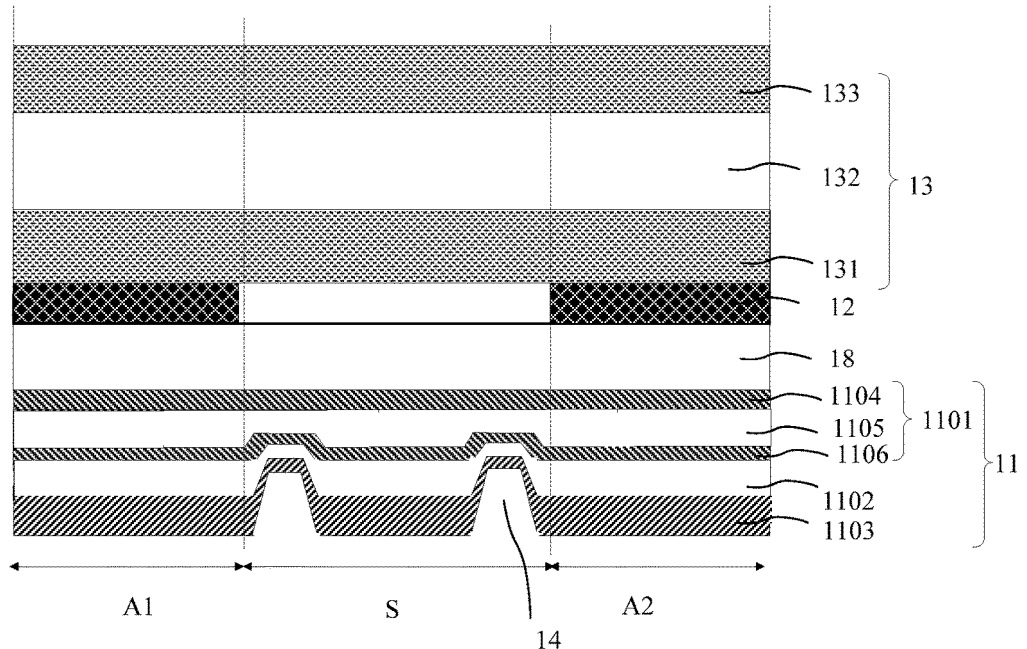
FIG. 9B illustrates a cross-sectional view of another exemplary flexible display panel according to disclosed embodiments.

FIG. 9B illustrates a cross-sectional view of another exemplary flexible display panel according to disclosed embodiments. The similarities between FIG. 9A and FIG. 9B are not repeated here, while certain differences may be explained.

As shown in FIG. 9B, the base substrate 1101 may include a first polyimide layer 1104, a second polyimide layer 1106, and a buffer layer 1105 sandwiched between the first polyimide layer 1104 and the second polyimide layer 1106. Through inserting the buffer layer 1105 between the first polyimide layer 1104 and the second polyimide layer 1106, the bending durability of base substrate 1101 may be improved and, meanwhile, the damage to the thin-film-transistors during laser lift-off may be suppressed. The buffer layer 1105 may be an inorganic layer.

The buffer layer 1105 may have a first side facing the organic light-emitting layer 12 and an opposing side. At least one groove 14 may be disposed on the opposing side of the buffer layer 1105 in the bending area S. Through introducing the buffer layer 1105 to be sandwiched between the first polyimide layer 1104 and the second polyimide layer 1106 and configuring the buffer layer 1105 with at least one groove 14 formed in the bending area S, the bending stress generated when the buffer layer 1105 is being bent may be reduced, and the bending durability of the flexible display panel may be further improved.

Figure 9C:
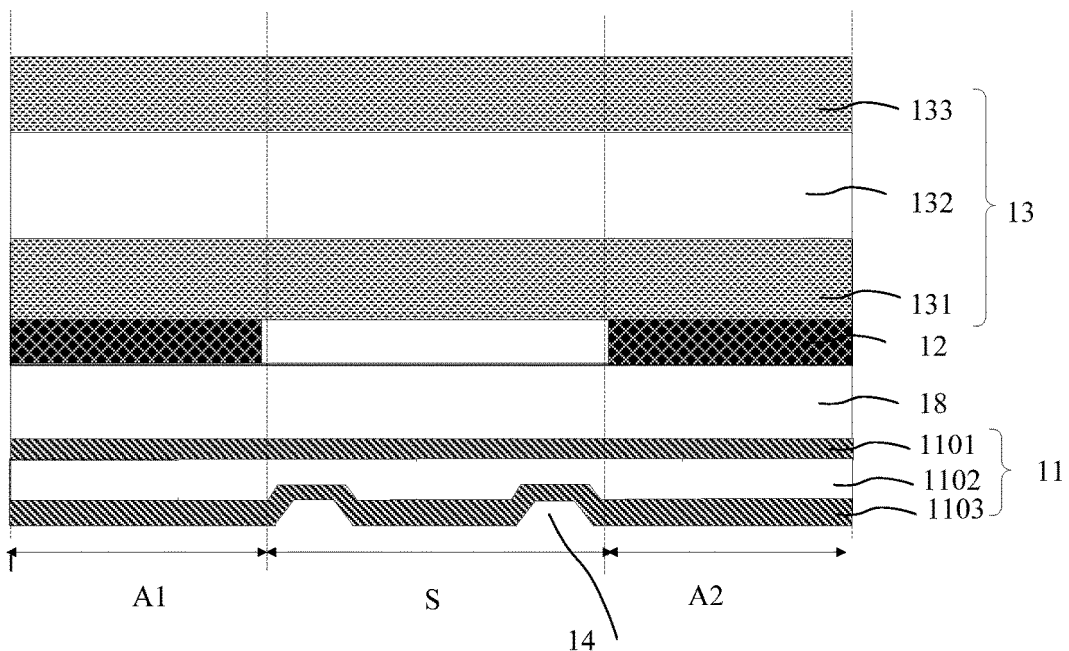
FIG. 9C illustrates a cross-sectional view of another exemplary flexible display panel according to disclosed embodiments.

FIG. 9C illustrates a cross-sectional view of another exemplary flexible display panel according to disclosed embodiments. The similarities between FIG. 9A and FIG. 9C are not repeated here, while certain differences may be explained.

As shown in FIG. 9C, the flexible substrate 11 may include a base substrate 1101, an adhesive layer 1102, and a lower protective layer 113. The lower protective film 1103 may be attached to the base substrate 1101 through the adhesive layer 1102. The adhesive layer 1102 may have a first side facing the organic light-emitting layer 12 and an opposing side. The flexible display panel may include at least one bending area S, and at least one groove 14 may be disposed on the opposing side of the adhesive layer 1102 in the bending area S.

The adhesive layer 1102 may be likely to be plastically deformed during bending, and when the thickness of the adhesive layer 1102 increases, the adhesive layer 1102 may be more likely to be plastically deformed and may be difficult to be restored to the original shape. Through disposing at least one groove 14 on the opposing side of the adhesive layer 1102 in the bending area S, the adhesive layer 1102 may be prevented from being plastically deformed when being bent, and the bending performance may be improved. That is, the desired adhesiveness may be achieved between the lower protective film 1103 and the base substrate 1101, and the bending reliability of the flexible display panel may be further enhanced.

Figure 9D:
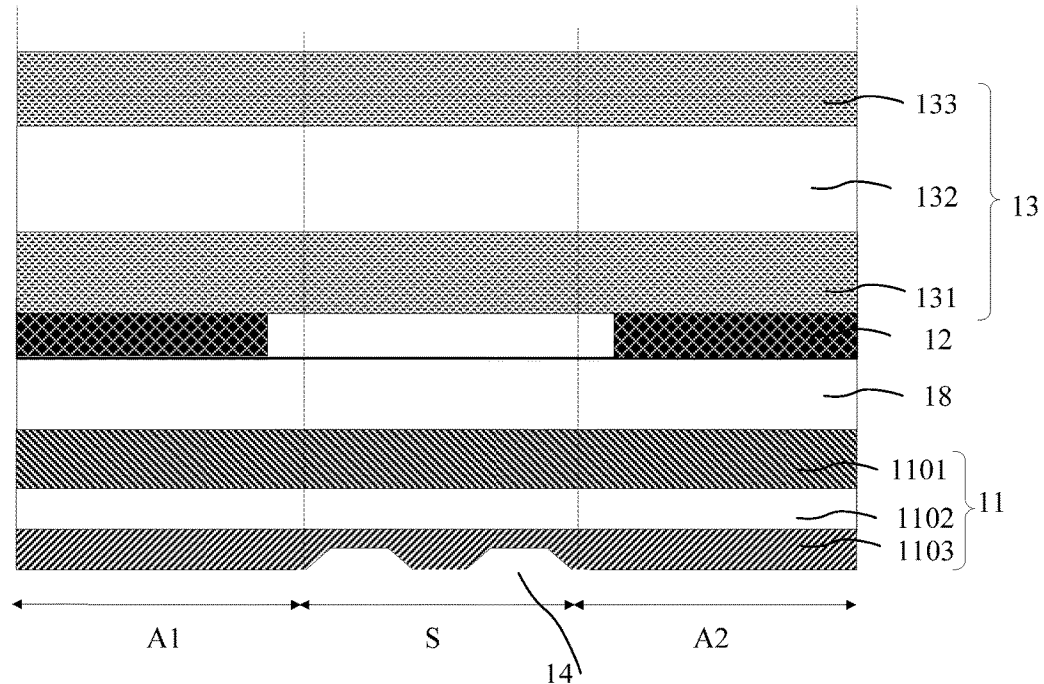
FIG. 9D illustrates a cross-sectional view of another exemplary flexible display panel according to disclosed embodiments.

FIG. 9D illustrates a cross-sectional view of another exemplary flexible display panel according to disclosed embodiments. The similarities between FIG. 9A and FIG. 9D are not repeated here, while certain differences may be explained.

As shown in FIG. 9D, the flexible substrate 11 may include a base substrate 1101, an adhesive layer 1102, and a lower protective layer 113. The lower protective film 1103 may be attached to the base substrate 1101 through the adhesive layer 1102. The lower protective film 1103 may have a first side facing the organic light-emitting layer 12 and an opposing side. At least one bending area may be disposed on the opposing side of the lower protective film 1103. The flexible display panel may include at least one bending area S. At least one groove 14 may be disposed on the opposing side of the lower protective film 1103 in the bending area S.

Through configuring the lower protective film 1103 with at least one groove 14 formed in the bending area S, the thickness of the flexible display panel at the bending area S may be reduced, and the bending stress may be reduced. Accordingly, the inorganic encapsulation layers in the thin-film-encapsulation layer 13 may be prevented from cracking or breaking caused by excessive bending stress when being bent, the bending reliability of the flexible display panel may be enhanced.

Figure 10:
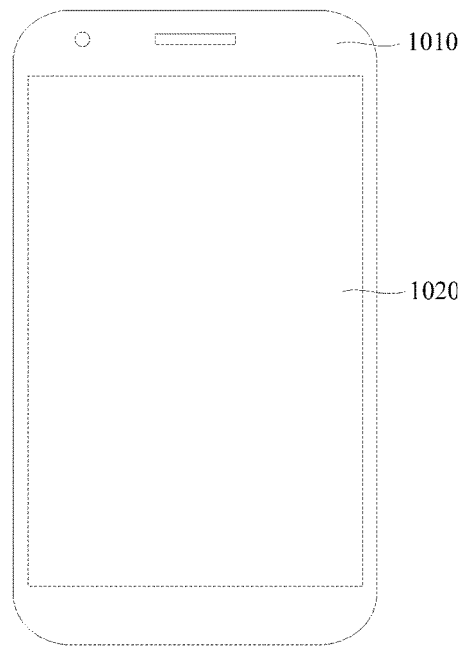
FIG. 10 illustrates a schematic view of another exemplary display apparatus according to disclosed embodiments.

The present disclosure also provides a display apparatus. The display apparatus may include a disclosed flexible display panel. FIG. 10 illustrates a schematic view of another exemplary display apparatus 1010 according to disclosed embodiments. As shown in FIG. 10, the display apparatus 1010 may include a flexible display panel 1020. The flexible display panel 1020 may be any one of the disclosed flexible display panels. Although a smart phone is shown in FIG. 11, the display apparatus 1010 may be a smart watch, a VR goggle, a smart hand band, an electronic paper, a television set, an automotive display, a notebook computer, a tablet computer, or any appropriate touch control display apparatus, which is not limited by the present disclosure.

Figure 11A:
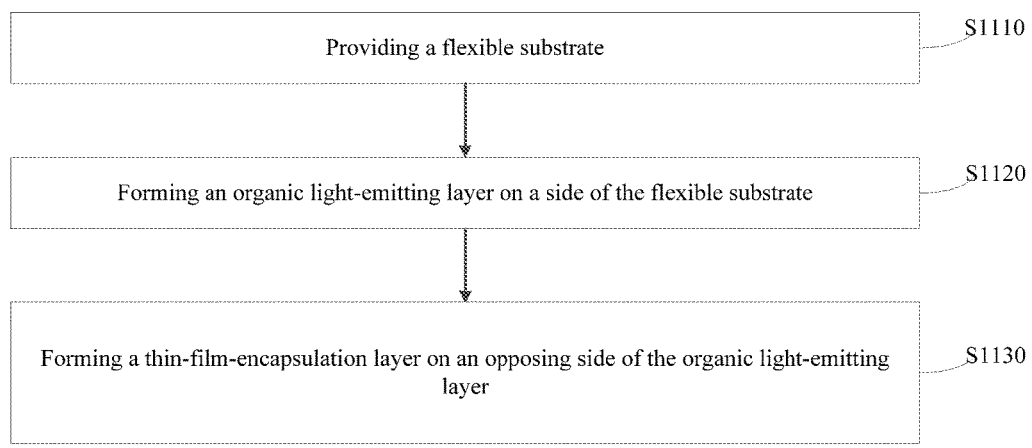
FIG. 11A illustrates a flow chart of another exemplary flexible display panel fabrication method according to disclosed embodiments.
Figure 11B:
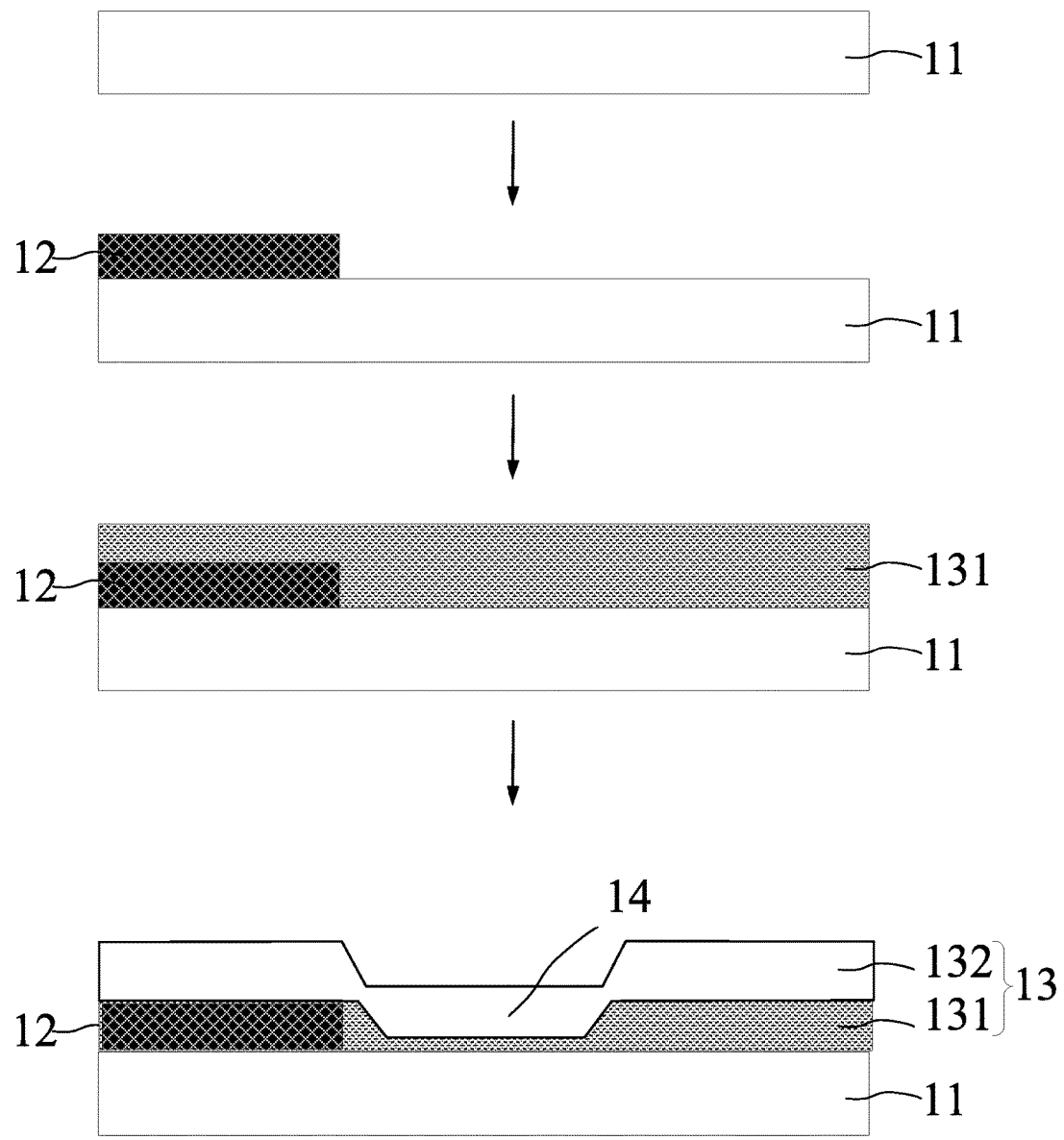
FIG. 11B illustrates cross-sectional views of an exemplary flexible display panel corresponding to various steps of another exemplary fabrication method according to disclosed embodiments.

FIG. 11A illustrates a flow chart of another exemplary fabrication method for an exemplary flexible display panel according to disclosed embodiments. FIG. 11B illustrates cross-sectional views of an exemplary flexible display panel corresponding to various step of another exemplary fabrication method according to disclosed embodiments.

As shown in FIG. 11A, at the beginning, a flexible substrate is provided (S1110). After the flexible substrate is provided, an organic light-emitting layer is formed on the flexible substrate (S1120). The corresponding structure is shown in FIG. 11B.

As shown in FIG. 11B, the organic light-emitting layer 12 may be formed by sputtering, vapor deposition, or similarly appropriate processes. In particular, through sputtering or vapor deposition, a first electrode of an organic light-emitting device may be formed in the organic light-emitting layer 12 on the flexible substrate 11. The first electrode may have a first side facing the flexible substrate and an opposing side. After the first electrode is formed, through sputtering or vapor deposition, an organic light-emitting material layer may be formed on the opposing side of the first electrode. The organic light-emitting material layer may have a first side facing the flexible substrate and an opposing side. After the organic light-emitting material layer is formed, through sputtering or vapor deposition, a second electrode may be formed on the opposing side of the organic light-emitting material layer. The first electrode or the second electrode may be a transparent electrode, a semi-transparent electrode, or a reflective electrode.

Returning to FIG. 11A, after the organic light-emitting layer is formed on the flexible substrate, the organic light-emitting layer has a first side facing the flexible substrate and an opposing side, a thin-film-encapsulation layer is formed on the opposing side of the organic light-emitting of the flexible substrate(S1130). The corresponding structure is shown in FIG. 11B.

As shown in FIG. 11B, the organic light-emitting layer 12 may have a first side facing the flexible substrate 11 and an opposing side. The thin-film-encapsulation layer 13 may be formed on the opposing side of the organic light-emitting layer 12. The thin-film-encapsulation layer 13 may include at least one organic encapsulation layer 132 and at least one inorganic encapsulation layer 131. The inorganic encapsulation layer 131 may have a first side facing the flexible substrate 11 and an opposing side. The fabricated flexible display panel may include at least one bending area, and at least one groove 14 may be formed on the opposing side of at least one inorganic encapsulation layer 131 in the bending area.

The bottom width W of the groove 14 may be configured to be $$W \geq \frac{n}{180°}\pi R,$$

where n is a maximum bending angle of the bending area, 0°<n≤180°, and R is a bending radius of the bending area. In one embodiment, the bottom width W of the groove 14 may be configured to be W≥πR.

In the disclosed embodiments, the organic encapsulation layer 132 may formed by an ink jet printing process. The inorganic encapsulation layer 131 may be formed by a chemical vapor deposition (CVD) process or an atomic layer deposition (ALD) process, and the groove 14 on the inorganic encapsulation layer 131 may be formed by etching.

Figure 11C:
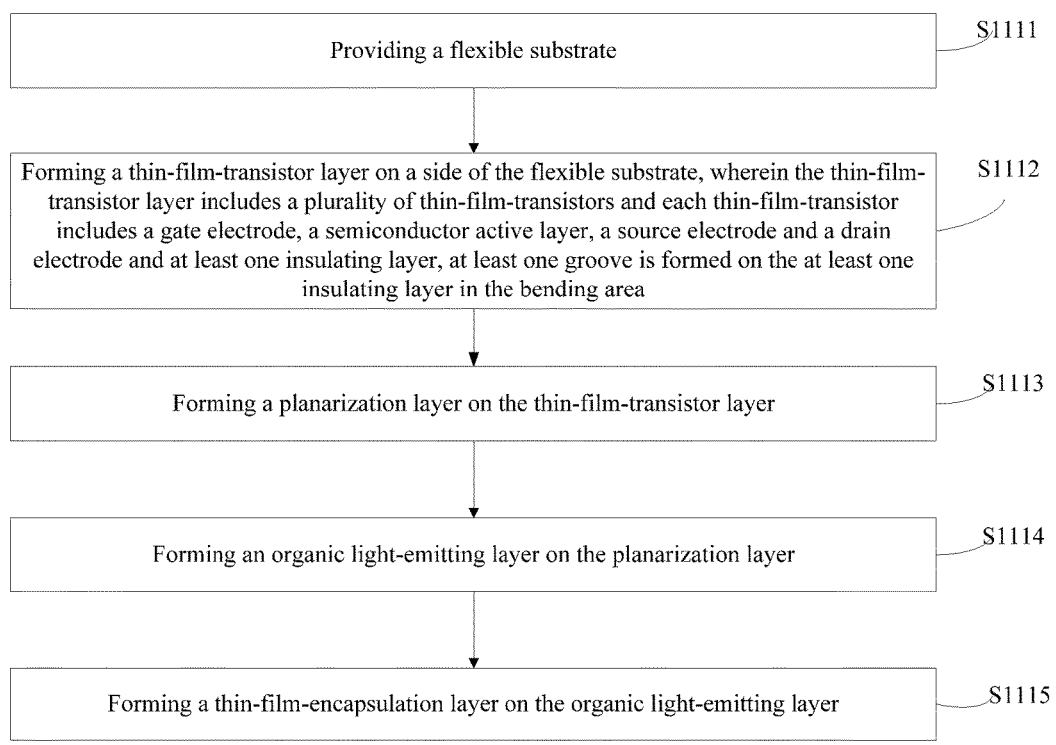
FIG. 11C illustrates a flow chart of another exemplary flexible display panel fabrication method according to disclosed embodiments.

FIG. 11C illustrates a flow chart of another exemplary fabrication method for an exemplary flexible display panel according to disclosed embodiments. The corresponding structure is shown in FIG. 8D.

As shown in FIG. 11C, at the beginning, a flexible substrate is provided (S1111). After the flexible substrate is provided, a thin-film-transistor layer is formed on a side of the flexible substrate (S1112). In particular, the thin-film-transistor layer may include a plurality of thin-film-transistors. Each thin-film-transistor may include a gate electrode, a semiconductor active layer, a source electrode and a drain electrode (i.e., source-drain electrode) and at least one insulating layer. The at least one insulating layer may have a first side facing the flexible substrate and an opposing side. In the bending area S, at least one groove may be formed on the opposing side of the at least one insulating layer. The bottom width W of the groove 14 may be configured to be $$W \geq \frac{n}{180°}\pi R,$$

where n is a maximum bending angle of the bending area, 0° <n≤180°, and R is a bending radius of the bending area. In one embodiment, the bottom width W of the groove 14 may be configured to be W≥πR.

In particular, the at least one insulating layer of the thin-film-transistor layer may include a gate electrode insulating layer and a passivation layer. The gate electrode insulating layer may be disposed between the gate electrode and the source-drain electrode. The passivation layer may be disposed on the gate electrode insulating layer and the gate electrode. That is, in the bending area, at least one groove may be formed on the opposing side of at least one of the passivation layer and the gate electrode insulating layer.

After the groove is formed on the opposing side of the passivation layer in the bending area, a planarization layer is formed on the thin-film-transistor layer (S1113). After the planarization layer is formed on the thin-film-transistor layer, an organic light-emitting layer is formed on the planarization layer (S1114). After the organic light-emitting layer is formed on the planarization layer, a thin-film-encapsulation layer is formed on the organic light-emitting layer (S1115).

Figure 11D:
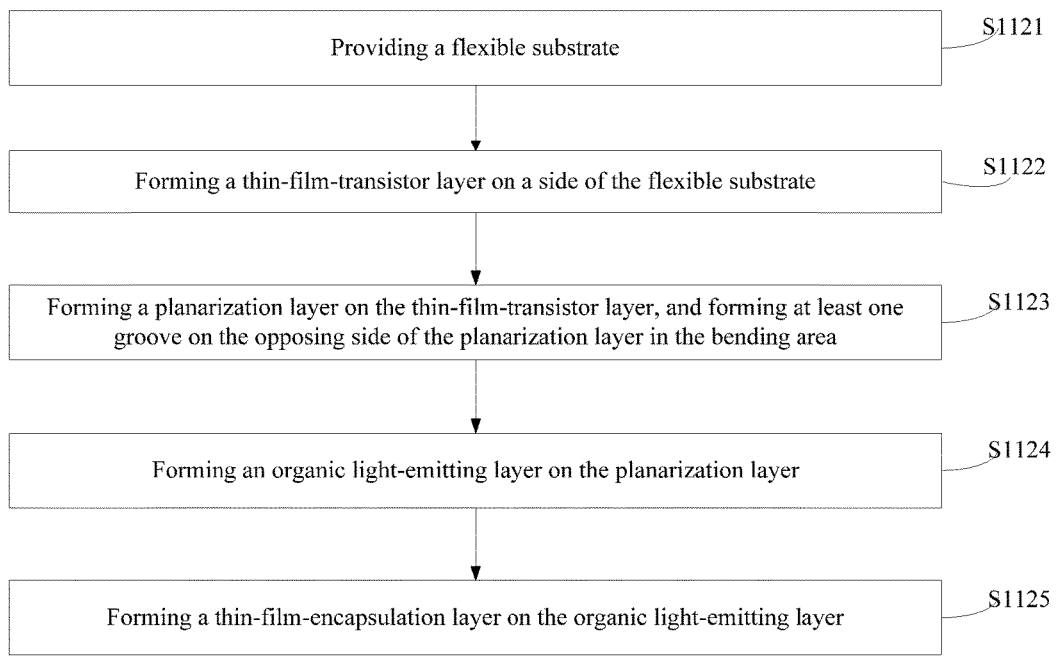
FIG. 11D illustrates a flow chart of another exemplary flexible display panel fabrication method according to disclosed embodiments.

FIG. 11D illustrates a flow chart of another exemplary fabrication method for an exemplary flexible display panel according to disclosed embodiments. The corresponding structure is shown in FIG. 8A.

As shown in FIG. 11D, at the beginning, a flexible substrate is provided (S1121). After the flexible substrate is provided, a thin-film-transistor layer is formed on a side of the flexible substrate (S1122). After the thin-film-transistor layer is formed on the flexible substrate, a planarization layer is formed on the thin-film-transistor layer, and the planarization layer has a first side facing the flexible substrate and an opposing side, and at least one groove is formed on the opposing side of the planarization layer in the bending area (S1123). The bottom width W of the groove 14 may be configured to be $$W \geq \frac{n}{180°}\pi R,$$

where n is a maximum bending angle of the bending area, 0°<n≤180°, and R is a bending radius of the bending area. In one embodiment, the bottom width W of the groove 14 may be configured to be W≥πR.

After the groove is formed on the opposing side of the planarization layer in the bending area, an organic light-emitting layer is formed on the planarization layer (S1124). After the organic light-emitting layer is formed on the planarization layer, a thin-film-encapsulation layer is formed on the organic light-emitting layer (S1125).

It should be noted that the various embodiments in the present specification are described in a progressive manner. Each embodiment is mainly described in terms of differences from the previously described embodiments. The similarities between different embodiments are not repeated, and may be incorporated by references.

Various embodiments have been described to illustrate the operation principles and exemplary implementations. It should be understood by those skilled in the art that the present invention is not limited to the specific embodiments described herein and that various other obvious changes, rearrangements, and substitutions will occur to those skilled in the art without departing from the scope of the invention. Thus, while the present invention has been described in detail with reference to the above described embodiments, the present invention is not limited to the above described embodiments, but may be embodied in other equivalent forms without departing from the scope of the present invention, which is determined by the appended claims.

What is claimed is:

1. A flexible display panel, comprising:
a flexible substrate;
an organic light-emitting layer disposed on a side of the flexible substrate and having a first side facing the flexible substrate and an opposing side; and
a thin-film-encapsulation layer disposed on the opposing side of the organic light-emitting layer,
wherein:
the flexible display panel includes at least one bending area,
the thin-film-encapsulation layer includes at least one organic encapsulation layer and at least one inorganic encapsulation layer, the at least one inorganic encapsulation layer has a first side facing the flexible substrate and an opposing side, in the at least one bending area, at least one groove is formed on the opposing side of the at least one inorganic encapsulation layer, and a bottom width W of the at least one groove is configured to be $$W \geq \frac{n}{180°}\pi R,$$

where n is a maximum bending angle of the at least one bending area, 0°<n≤180°, and R is a bending radius of the at least one bending area.

2. The flexible display panel according to claim 1, wherein:
the bottom width W of the at least one groove is W≥πR.

3. The flexible display panel according to claim 1, wherein:
the bending radius R is greater than or equal to about 0.1 mm.

4. The flexible display panel according to claim 1, wherein:
the thin-film-encapsulation layer includes a first inorganic encapsulation layer, a second inorganic encapsulation layer, and a first organic encapsulation layer,
wherein the first organic encapsulation layer is disposed between the first inorganic encapsulation layer and the second inorganic encapsulation layer;
the first inorganic encapsulation layer is disposed between the organic light-emitting layer and the first organic encapsulation layer; and
in the at least one bending area, the at least one groove is formed on at least one of the first inorganic encapsulation layer and the second inorganic encapsulation layer.

5. The flexible display panel according to claim 1, wherein:
the thin-film-encapsulation layer includes a first inorganic encapsulation layer, a first organic encapsulation layer, a second inorganic encapsulation layer, a second organic encapsulation layer, and a third inorganic encapsulation layer, which are configured sequentially on the opposing side of the organic light-emitting layer; and
in the at least one bending area, the at least one groove is formed on at least one of the first inorganic encapsulation layer, the second inorganic encapsulation layer and the third inorganic encapsulation layer.

6. The flexible display panel according to claim 1, wherein:
the at least one groove has a thickness of approximately between 1 μm and 20 μm.

7. The flexible display panel according to claim 1, comprising at least one of the following:
a bottom of the at least one groove transitions to a side wall of the at least one groove through a first curved line; and
the side wall of the at least one groove transitions to a non-recessed surface of the at least one organic encapsulation layer through a second curved line.

8. The flexible display panel according to claim 7, wherein:

an angle α between the first curved line and the bottom of the at least one groove is approximately in a range of 0°<α≤70°.

9. The flexible display panel according to claim 8, wherein:
an angle β between the second curved line and the non-recessed surface of the at least one organic encapsulation layer is approximately in a range of 0°<β≤60°.

10. The flexible display panel according to claim 7, wherein:
an angle α between the first curved line and the bottom of the at least one groove is approximately in a range of 15°<α≤70°.

11. The flexible display panel according to claim 10, wherein:
an angle β between the second curved line and the non-recessed surface of the at least one organic encapsulation layer is approximately in a range of 15°<β≤45°.

12. The flexible display panel according to claim 1, wherein:
the at least one bending area includes a plurality of grooves; and
the plurality of the grooves is arranged in parallel in a direction perpendicular to an extension direction of a groove.

13. The flexible display panel according to claim 1, wherein:
the flexible display panel includes a display area and a non-display area surrounding the display area; and
at least one of the display area and the non-display area is configured with the at least one bending area.

14. The flexible display panel according to claim 13, wherein:
a peripheral circuit is configured in the non-display area; and
the peripheral circuit at least partially overlaps with the at least one bending area in a direction perpendicular to the flexible substrate.

15. The flexible display panel according to claim 13, wherein:
the display area includes two sections; and
the at least one bending area is disposed between the two sections of the display area.

16. The flexible display panel according to claim 13 wherein:
an orthogonal projection of the at least one groove onto the organic light-emitting layer is located between two rows or two columns of sub-pixels.

17. A flexible display apparatus comprising the flexible display panel according to claim 1.

18. A flexible display panel, comprising:
a flexible substrate;
a thin-film-transistor layer disposed on the flexible substrate, wherein the thin-film-transistor layer includes at least one insulating layer, and the thin-film-transistor layer has a first side facing the flexible substrate and an opposing side;
a planarization layer disposed on the opposing side of the thin-film-transistor layer, wherein the planarization layer has a first side facing the flexible substrate and an opposing side;
an organic light-emitting layer disposed on the opposing side of the planarization layer, wherein the organic light-emitting layer has a first side facing the flexible substrate and an opposing side, the organic light-emitting layer includes a plurality of organic light-emitting components, an organic light-emitting component includes a first electrode, a pixel defining layer, an organic light-emitting material layer and a second electrode arranged disposed on the flexible substrate;
a thin-film-encapsulation layer disposed on the opposing side of the organic light-emitting layer, wherein the thin-film-encapsulation layer includes at least one organic encapsulation layer and at least one inorganic encapsulation layer; and
a plurality of photo spacers disposed between the organic light-emitting layer and the thin-film-encapsulation layer, wherein:

the flexible display panel includes at least one bending area, in the at least one bending area, at least one groove is formed on a photo spacer, the pixel defining layer in the organic light-emitting layer, the at least one insulating layer in the thin-film-transistor layer, or the planarization layer, and a bottom width W of the at least one groove is configured to be $$W \geq \frac{n}{180°}\pi R,$$

where n is a maximum bending angle of the at least one bending area, 0°<n≤180°, and R is a bending radius of the at least one bending area.

19. The flexible display panel according to claim 18, wherein:
the bottom width W of the at least one groove is W≥πR.

20. The flexible display panel according to claim 18, wherein:
the thin-film-transistor layer includes a plurality of thin-film-transistors;
a thin-film-transistor includes a gate electrode, a source-drain electrode, a semiconductor active layer, a gate electrode insulating layer disposed between the gate electrode and semiconductor active layer and between the gate electrode and the source-drain electrode, a passivation layer disposed between the gate electrode insulating layer and the planarization layer; and
the at least one insulating layer of the thin-film-transistor layer includes the gate electrode insulating layer and the passivation layer.

21. The flexible display panel according to claim 20, wherein:
the gate electrode insulating layer has a first side facing the flexible substrate and an opposing side; and
in the at least one bending area, the at least one groove is formed on the opposing side of the gate electrode insulating layer.

22. The flexible display panel according to claim 20, wherein:
the passivation layer has a first side facing the flexible substrate and an opposing side; and
in the at least one bending area, the at least one groove is formed on the opposing side of the passivation layer.

23. The flexible display panel according to claim 18, wherein:
the pixel defining layer has a first side facing the flexible substrate and an opposing side; and
in the at least one bending area, the at least one groove is formed on the opposing side of the pixel defining layer.

24. A flexible display apparatus comprising the flexible display panel according to claim 18.

* * * * *